US010170953B2

(12) United States Patent
Shaw

(10) Patent No.: US 10,170,953 B2
(45) Date of Patent: Jan. 1, 2019

(54) PLANAR COMPOSITE STRUCTURES AND ASSEMBLIES FOR AXIAL FLUX MOTORS AND GENERATORS

(71) Applicant: E-Circuit Motors, Inc., Newton, MA (US)

(72) Inventor: Steven Robert Shaw, Bozeman, MT (US)

(73) Assignee: E-Circuit Motors, Inc., Newton, MA (US)

(*) Notice: Subject to any disclaimer, the term of this patent is extended or adjusted under 35 U.S.C. 154(b) by 0 days.

(21) Appl. No.: 15/852,972

(22) Filed: Dec. 22, 2017

(65) Prior Publication Data

US 2018/0138770 A1 May 17, 2018

Related U.S. Application Data

(63) Continuation-in-part of application No. 15/611,359, filed on Jun. 1, 2017, now Pat. No. 9,859,763, which
(Continued)

(51) Int. Cl.
*H02K 3/26* (2006.01)
*H02K 1/18* (2006.01)
(Continued)

(52) U.S. Cl.
CPC .............. *H02K 3/26* (2013.01); *H02K 1/182* (2013.01); *H02K 1/27* (2013.01); *H02K 3/50* (2013.01); *H02K 21/24* (2013.01); *H05K 1/0298* (2013.01)

(58) Field of Classification Search
CPC .. H02K 1/18; H02K 1/27; H02K 3/50; H02K 3/26; H02K 1/182; H05K 1/02; H05K 1/0298
(Continued)

(56) References Cited

U.S. PATENT DOCUMENTS 2,970,238 A  1/1961  Swiggett
3,096,455 A  7/1963  Hahn
(Continued)

FOREIGN PATENT DOCUMENTS

CN  103001426 A  3/2013
CN  104426263 A  3/2015
(Continued)

OTHER PUBLICATIONS

International Search Report and Written Opinion for Application No. PCT/US2016/054794, dated Jan. 4, 2017.
(Continued)

*Primary Examiner* — Naishadh N Desai
(74) *Attorney, Agent, or Firm* — Pierce Atwood LLP

(57) ABSTRACT

A planar composite structure (PCS) for use in an axial flux motor or generator may include a conductive layer disposed on a dielectric layer, with the conductive layer comprising conductive traces that form portions of at least two windings that, when energized, generate magnetic flux for at least two corresponding phases of the motor or generator. A PCS may additionally or alternatively include a first conductive layer comprising first conductive traces that form a first portion of a winding that, when energized, generates magnetic flux for a first phase of the motor or generator, and a second conductive layer, which is different than the at least one first conductive layer, comprising second conductive traces that form a second portion of the winding. The first portion of the winding may be connected in series with the second portion of the winding, and the first and second portions of the winding may be configured and arranged such that a same amount of current flows through each of the first and second portions of the winding.

30 Claims, 26 Drawing Sheets

Related U.S. Application Data is a continuation-in-part of application No. 15/283,088, filed on Sep. 30, 2016, now Pat. No. 9,800,109, which is a continuation-in-part of application No. 15/199,527, filed on Jun. 30, 2016, now Pat. No. 9,673,684, said application No. 15/611,359 is a continuation-in-part of application No. 15/208,452, filed on Jul. 12, 2016, now Pat. No. 9,673,688.

(60) Provisional application No. 62/530,552, filed on Jul. 10, 2017, provisional application No. 62/275,653, filed on Jan. 6, 2016, provisional application No. 62/236,407, filed on Oct. 2, 2015, provisional application No. 62/236,422, filed on Oct. 2, 2015.

(51) Int. Cl.
*H05K 1/02* (2006.01)
*H02K 3/50* (2006.01)
*H02K 1/27* (2006.01)
*H02K 21/24* (2006.01)

(58) Field of Classification Search
USPC .......................................................... 310/184
See application file for complete search history.

(56) References Cited

U.S. PATENT DOCUMENTS

| | | |
|---|---|---|
| 4,115,915 A | 9/1978 | Godfrey |
| 4,658,162 A | 4/1987 | Koyama et al. |
| 4,677,332 A | 6/1987 | Heyraud |
| 4,733,115 A * | 3/1988 | Barone ............... H02K 3/26 310/184 |
| 4,804,574 A | 2/1989 | Osawa et al. |
| 5,099,162 A | 3/1992 | Sawada |
| 5,126,613 A | 6/1992 | Choi |
| 5,332,460 A | 7/1994 | Hosoya |
| 5,592,037 A | 1/1997 | Sickafus |
| 5,644,183 A | 7/1997 | Van Loenen et al. |
| 5,710,476 A | 1/1998 | Ampela |
| 5,952,742 A | 9/1999 | Stoiber et al. |
| 6,628,038 B1 | 9/2003 | Shikayama et al. |
| 7,109,625 B1 | 9/2006 | Jore et al. |
| 7,112,910 B2 | 9/2006 | Lopatinsky et al. |
| 7,301,428 B2 | 11/2007 | Suzuki et al. |
| 7,415,756 B2 | 8/2008 | Ishida et al. |
| 7,523,540 B2 | 4/2009 | Morel |
| 7,750,522 B2 | 7/2010 | Gizaw et al. |
| 7,812,697 B2 | 10/2010 | Fullerton et al. |
| 7,882,613 B2 | 2/2011 | Barthelmie et al. |
| 8,058,762 B2 | 11/2011 | Asano |
| 8,225,497 B2 | 7/2012 | Johnson et al. |
| 8,339,019 B1 | 12/2012 | Oyague |
| 8,362,731 B2 | 1/2013 | Smith et al. |
| 8,397,369 B2 | 3/2013 | Smith et al. |
| 8,400,038 B2 | 3/2013 | Smith et al. |
| 8,558,425 B2 | 10/2013 | Stahlhut et al. |
| 8,598,761 B2 | 12/2013 | Langford et al. |
| 8,692,637 B2 | 4/2014 | Richards et al. |
| 8,716,913 B2 | 5/2014 | Kvam et al. |
| 8,723,052 B1 | 5/2014 | Sullivan et al. |
| 8,723,402 B2 | 5/2014 | Oyague |
| 8,736,133 B1 | 5/2014 | Smith et al. |
| 8,785,784 B1 * | 7/2014 | Duford ............... H02K 3/26 174/255 |
| 8,823,241 B2 | 9/2014 | Jore et al. |
| 8,941,961 B2 | 1/2015 | Banerjee et al. |
| 9,013,257 B2 | 4/2015 | Steingroever |
| 9,154,024 B2 | 10/2015 | Jore et al. |
| 9,269,483 B2 | 2/2016 | Smith et al. |
| 9,479,038 B2 | 10/2016 | Smith et al. |
| 9,673,684 B2 | 6/2017 | Shaw |
| 2006/0055265 A1 | 3/2006 | Zalusky |
| 2006/0202584 A1 * | 9/2006 | Jore ............... H02K 21/24 310/179 |
| 2007/0247014 A1 * | 10/2007 | Schach ............... H02K 23/02 310/184 |
| 2008/0067874 A1 | 3/2008 | Tseng |
| 2008/0100166 A1 | 5/2008 | Stahlhut et al. |
| 2009/0021333 A1 | 1/2009 | Fiedler |
| 2009/0072651 A1 | 3/2009 | Yon et al. |
| 2010/0000112 A1 | 1/2010 | Carow et al. |
| 2010/0123372 A1 | 5/2010 | Huang et al. |
| 2012/0033236 A1 | 2/2012 | Tsugimura |
| 2012/0041062 A1 | 2/2012 | Zhou et al. |
| 2012/0217831 A1 | 8/2012 | Jore et al. |
| 2012/0262019 A1 | 10/2012 | Smith et al. |
| 2012/0262020 A1 | 10/2012 | Smith et al. |
| 2013/0049500 A1 | 2/2013 | Shan et al. |
| 2013/0052491 A1 | 2/2013 | Bull et al. |
| 2013/0053942 A1 | 2/2013 | Kamel et al. |
| 2013/0072604 A1 | 3/2013 | Bowen, III et al. |
| 2013/0076192 A1 | 3/2013 | Tanimoto |
| 2013/0119802 A1 | 5/2013 | Smith et al. |
| 2013/0214631 A1 | 8/2013 | Smith et al. |
| 2013/0234566 A1 | 9/2013 | Huang et al. |
| 2014/0021968 A1 | 1/2014 | Lee |
| 2014/0021969 A1 | 1/2014 | Tseng et al. |
| 2014/0021972 A1 | 1/2014 | Barabi et al. |
| 2014/0028149 A1 | 1/2014 | Oyague |
| 2014/0042868 A1 | 2/2014 | Sullivan et al. |
| 2014/0152136 A1 | 6/2014 | Duford et al. |
| 2014/0175922 A1 | 6/2014 | Jore et al. |
| 2014/0201291 A1 | 7/2014 | Russell |
| 2014/0262499 A1 | 9/2014 | Smith et al. |
| 2014/0268460 A1 | 9/2014 | Banerjee et al. |
| 2014/0368079 A1 | 12/2014 | Wong et al. |
| 2015/0084446 A1 | 3/2015 | Atar |
| 2015/0188375 A1 | 7/2015 | Sullivan et al. |
| 2015/0188391 A1 | 7/2015 | Carron et al. |
| 2015/0311756 A1 | 10/2015 | Sullivan |
| 2015/0318751 A1 | 11/2015 | Smith et al. |
| 2016/0247616 A1 | 8/2016 | Smith et al. |
| 2016/0372995 A1 | 12/2016 | Smith et al. |
| 2017/0040878 A1 | 2/2017 | Smith et al. |
| 2017/0098973 A1 | 4/2017 | Shaw |
| 2017/0098982 A1 | 4/2017 | Shaw |

FOREIGN PATENT DOCUMENTS

| | | |
|---|---|---|
| CN | 105871089 A | 8/2016 |
| EP | 0563852 A1 | 10/1993 |
| EP | 2882079 A2 | 6/2015 |
| FR | 2262880 A1 | 9/1975 |
| GB | 2485185 A | 5/2012 |
| JP | 58036145 A | 3/1983 |
| JP | 59213287 A | 12/1984 |
| WO | 2004015843 A1 | 2/2004 |
| WO | 2004073365 A2 | 8/2004 |
| WO | 2009068079 A1 | 6/2009 |

OTHER PUBLICATIONS

International Search Report and Written Opinion for Application No. PCT/US2016/054704, dated Jan. 20, 2017.
International Search Report and Written Opinion for Application No. PCT/US20108/039500, dated Sep. 20, 2018.

* cited by examiner

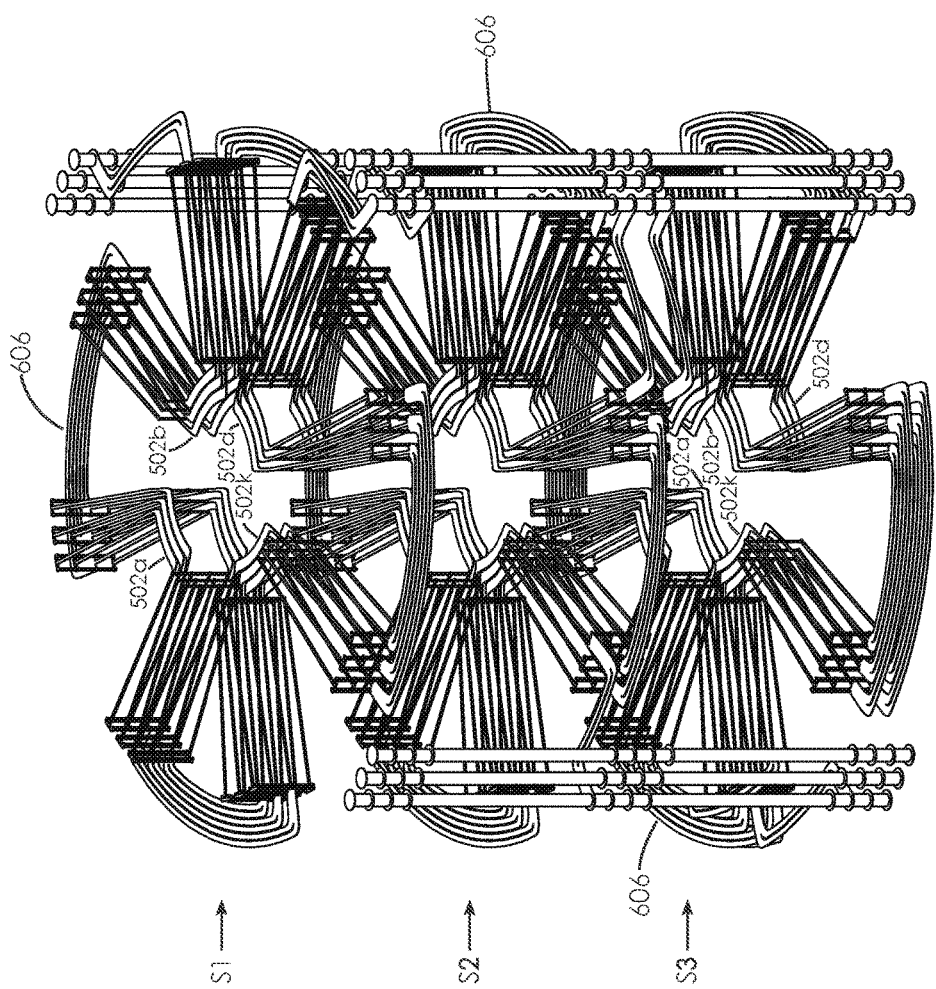

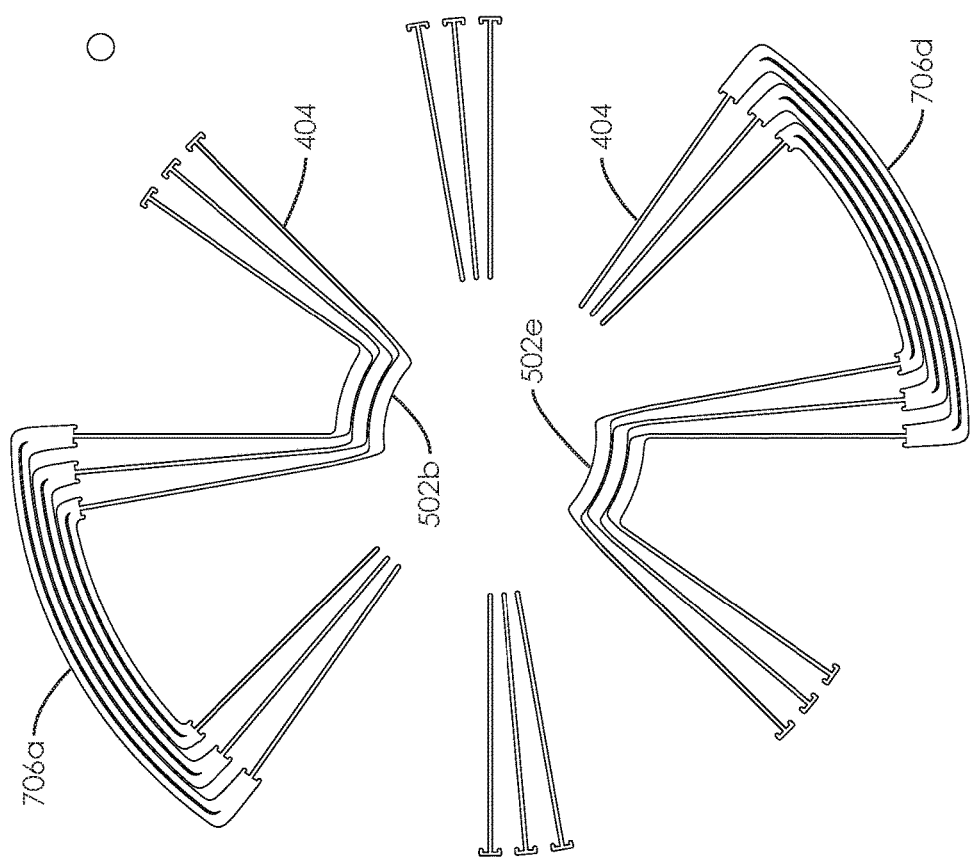

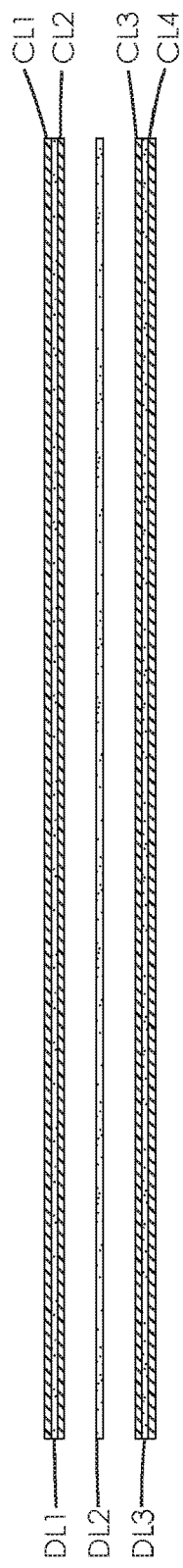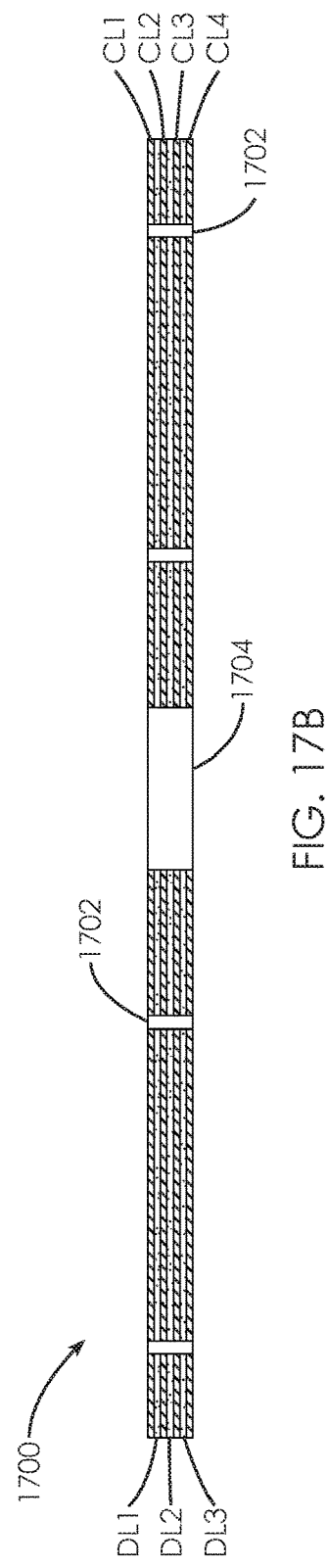
FIG. 17A
FIG. 17B

PLANAR COMPOSITE STRUCTURES AND ASSEMBLIES FOR AXIAL FLUX MOTORS AND GENERATORS

RELATED APPLICATIONS

This application claims the benefit under 35 U.S.C. § 119(e) of U.S. Provisional Application Ser. No. 62/530,552, entitled STRUCTURES AND METHODS OF STACKING SUBASSEMBLIES IN PLANAR COMPOSITE STATORS TO OBTAIN HIGHER WORKING VOLTAGES, filed Jul. 10, 2017. This application is also a continuation-in-part of and claims the benefit under 35 U.S.C. § 120 to U.S. patent application Ser. No. 15/611,359, entitled STRUCTURES AND METHODS FOR CONTROLLING LOSSES IN PRINTED CIRCUIT BOARDS, filed Jun. 1, 2017, and published as U.S. Patent Application Publication No. 2017-0271936 A1, which (A) is a continuation-in-part of and claims the benefit under 35 U.S.C. § 120 to U.S. patent application Ser. No. 15/283,088, entitled STRUCTURES AND METHODS FOR CONTROLLING LOSSES IN PRINTED CIRCUIT BOARDS, filed Sep. 30, 2016, and now U.S. Pat. No. 9,800,109, which is a continuation-in-part and claims the benefit under 35 U.S.C. § 120 to U.S. patent application Ser. No. 15/199,527, entitled STRUCTURES AND METHODS FOR THERMAL MANAGEMENT IN PRINTED CIRCUIT BOARD STATORS, filed Jun. 30, 2016, and now U.S. Pat. No. 9,673,684, and which also claims the benefit under 35 U.S.C. § 119(e) to each of U.S. Provisional Patent Application Ser. No. 62/236,407, entitled STRUCTURES TO REDUCE LOSSES IN PRINTED CIRCUIT BOARD WINDINGS, filed Oct. 2, 2015, and U.S. Provisional Patent Application Ser. No. 62/236,422, entitled STRUCTURES FOR THERMAL MANAGEMENT IN PRINTED CIRCUIT BOARD STATORS, filed Oct. 2, 2015, and (B) is a continuation-in-part of and claims the benefit under 35 U.S.C. § 120 to U.S. patent application Ser. No. 15/208,452, entitled APPARATUS AND METHOD FOR FORMING A MAGNET ASSEMBLY, filed Jul. 12, 2016, and now U.S. Pat. No. 9,673,688, which claims the benefit under 35 U.S.C. § 119(e) to U.S. Provisional Patent Application Ser. No. 62/275,653, entitled ALIGNMENT OF MAGNETIC COMPONENTS IN AXIAL FLUX MACHINES WITH GENERALLY PLANAR WINDINGS, filed Jan. 6, 2016. The contents of each of the foregoing applications, publications, and patents are hereby incorporated herein, by reference, in their entireties, for all purposes.

BACKGROUND

It is known to use a planar composite structure (PCS) as a stator in an axial flux motor or generator. An example of such a stator is described in U.S. Pat. No. 7,109,625 ("the '625 patent").

SUMMARY

In some embodiments, a planar composite structure (PCS) for use in an axial flux motor or generator comprises a dielectric layer, and a first conductive layer disposed on the dielectric layer. The first conductive layer comprises first conductive traces that form a first portion of a first winding that, when energized, generates magnetic flux for a first phase of the motor or generator, as well as a first portion of a second winding that, when energized, generates magnetic flux for a second phase of the motor or generator.

In some embodiments, a planar composite structure (PCS) for use in an axial flux motor or generator comprises a dielectric layer, a first conductive layer located on a first side of the dielectric layer, and a second conductive layer located on a second side of the dielectric layer. The first conductive layer comprise first conductive traces that form a first portion of a winding that, when energized, generates magnetic flux for a first phase of the motor or generator. The second conductive layer comprises second conductive traces that form a second portion of the winding. The first portion of the winding is connected in series with the second portion of the winding, and first and second portions of the winding are configured and arranged such that a same amount of current flows through each of the first and second portions of the winding.

In some embodiments, a planar composite structure (PCS) for use in an axial flux motor or generator comprises a first conductive layer comprising first conductive traces, a second conductive layer comprising second conductive traces, a third conductive layer comprising third conductive traces, and a fourth conductive layer comprising fourth conductive traces. The first conductive traces include first radial conductors that extend radially from a first radial distance to a second radial distance that is greater than the first radial distance, the second conductive traces include second radial conductors that extend radially from the first radial distance to the second radial distance, the third conductive traces including third radial conductors that extend radially from the first radial distance to the second radial distance, and the fourth conductive traces including fourth radial conductors that extend radially from the first radial distance to the second radial distance. The first radial conductors are electrically connected to corresponding ones of the second radial conductors by first blind or buried vias, and the third radial conductors are electrically connected to corresponding ones of the fourth radial conductors by second blind or buried vias.

In some embodiments, a planar composite structure (PCS) for use in axial flux motor or generator comprises a subassembly comprising first conductive layers that include first radial conductors that extend radially from a first radial distance to a second radial distance that is greater than the first radial distance, first end turn conductors, and second end turn conductors. The first end turn conductors interconnect a first group of the first radial conductors to form a first winding for a first phase of the axial flux motor or generator. The second end turn conductors interconnect a second group of the first radial conductors to form a second winding for a second phase of the axial flux motor or generator. The first subassembly includes more second end turn conductors than first end turn conductors.

BRIEF DESCRIPTION OF THE DRAWINGS

FIG. 13A illustrates the positions of inner end turns and outer end turns for a second phase within the stack of three subassemblies shown in FIG. 12A;

FIG. 15B show the portions of the upper conductive layer shown in FIG. 15A that contribute to the windings for the first phase;

FIGS. 17A and 17B illustrate an example of a process for forming a multi-layer PCS assembly/subassembly;

DETAILED DESCRIPTION

A planar composite structure (PCS) that may be used, for example, as a stator in an axial flux motor or generator, can be constructed by forming multiple layers of conductive traces (conductive layers) on one or more layers of non-conductive, dielectric material (dielectric layers). Examples of stators of this type are described in U.S. Pat. No. 7,109,625 ("the '625 patent"), U.S. Pat. No. 9,673,688, U.S. Pat. No. 9,673,684, and U.S. Pat. No. 9,800,109, the entire contents of each of which is incorporated herein by reference.

Figure 1:
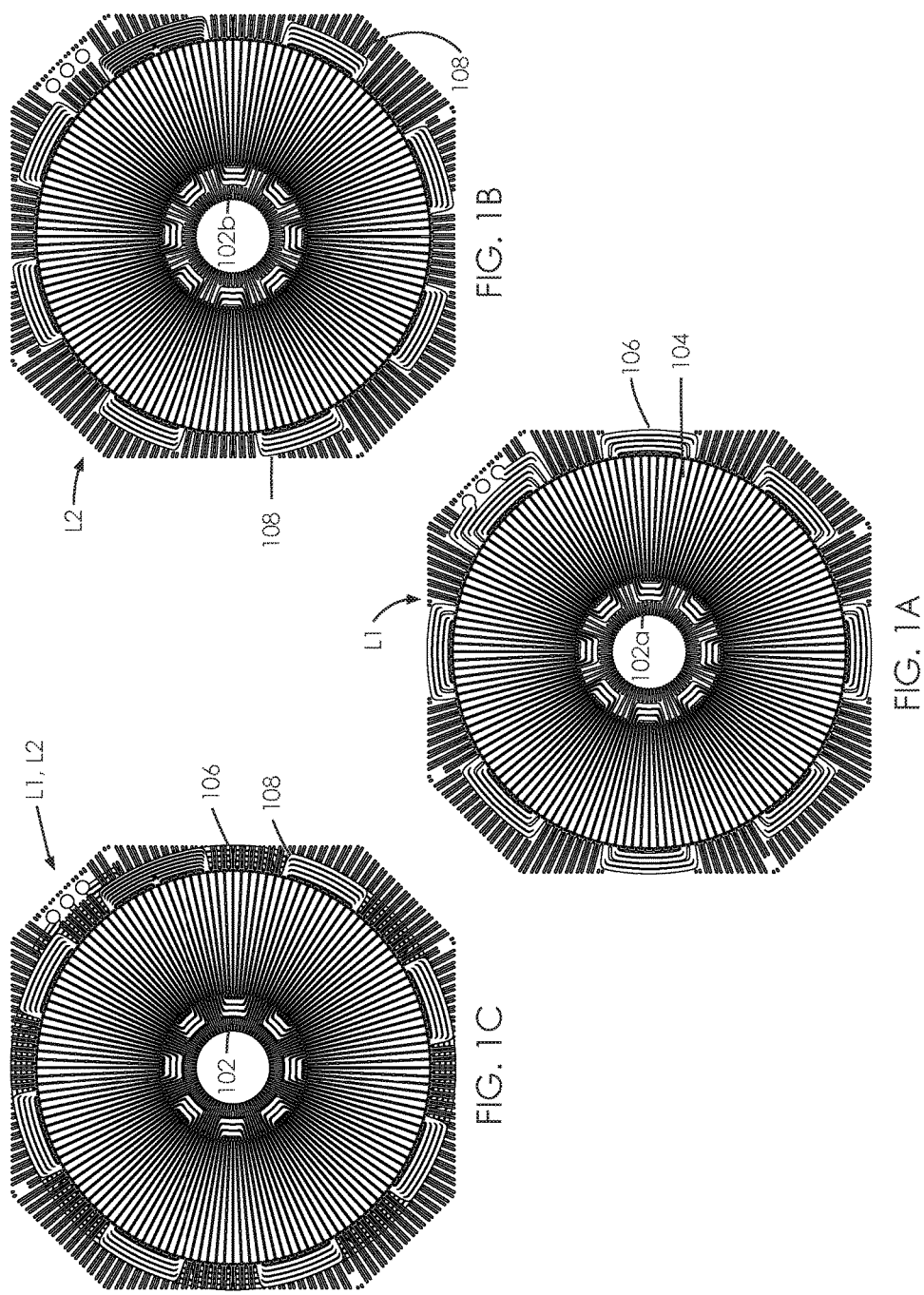
FIG. 1A illustrates a "turns layer" of a planar stator having a winding layout like that described in U.S. Pat. No. 7,109,625 ("the '625 patent")
FIG. 1B illustrates a "link layer" of a planar stator having a winding layout like that described in the '625 patent.
FIG. 1C illustrates the link layer shown in FIG. 1B on top of the turns layer shown in FIG. 1A, with hidden lines removed.

FIGS. 1A-C show plan views of two conductive layers of a planar stator having a winding layout like that described in the '625 patent. Together, the layers shown establish the inner and outer "end turns" needed for a single phase. FIG. 1A shows a single "turns layer" L1 with inner end turns 102a and outer end turns 106 that arrange the radial traces 104 in coils that are each associated with a pole pair. On this sixteen-pole stator, there are eight such coils. In the example shown, the coils spiral in, such that the end-point of each coil cannot be routed to the beginning point of a subsequent coil on the same layer. This routing difficulty is described in more detail below in connection with FIG. 8. FIG. 1B shows a "link layer" L2, which includes links 108 that serve to connect subsequent coils without interference with the turns layer L1. Each of the radial traces 104 on the layer L1 is connected to a corresponding (and parallel) radial trace 104 on the layer L2, e.g., using vias (not shown). The link layer L2 also includes inner end turns 102b which are redundant with inner end turns 102a in the turns layer L1. FIG. 1C shows the link layer L2 on top of the turns layer L1, with hidden lines removed. As seen, in this configuration, the outer end turns 106 and links 108 occupy some of the same space on the outer radius of the stator. Thus, a complete stator of three phases having a winding layout like that taught by the '625 patent requires a minimum of six conductive layers (i.e., three phases times two layers per phase). A balanced stator employing such a winding layout thus requires a multiple of six conductive layers. As used herein a "balanced stator" refers to a stator in which the electrical load characteristics (in motor mode) or electrical source characteristics (in generator mode) of each phase are equal up to an electrical phase angle.

With respect to FIGS. 1A-C, it should be appreciated that certain details of the depicted design, e.g., particular structures and/or configurations for thermal management and loss reduction, such as those disclosed in U.S. Pat. Nos. 9,673, 684 and 9,800,109, are not disclosed in the '625 patent. FIGS. 1A-C thus illustrate only the relative positions of radial traces, inner end turns, outer end turns, and links as taught by the '625 patent, and not the particular structures or configurations the '625 patent discloses for those elements.

Figure 2:
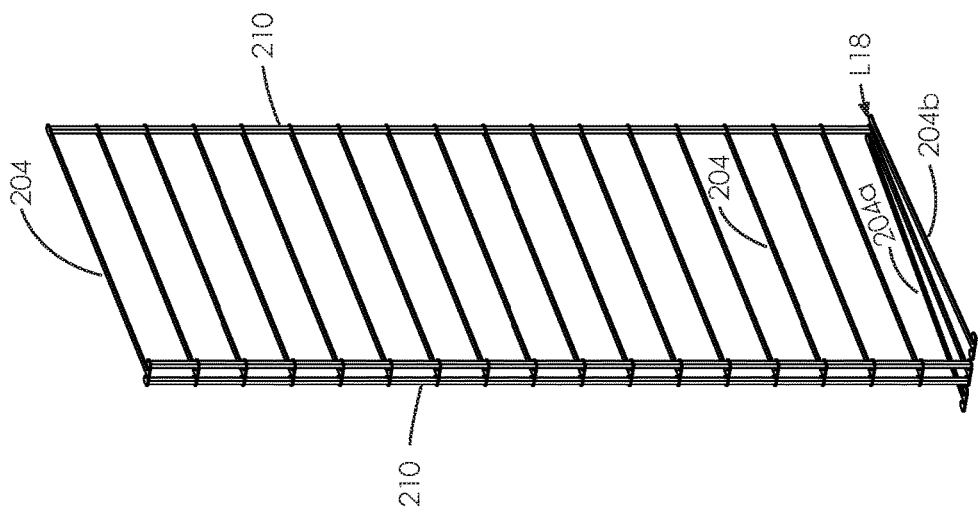
FIG. 2 shows a selected view of a portion of a stator configuration having a stack of three six-layer subassemblies.

Stators have been designed in which multiple three-phase, balanced stator subassemblies (having six conductive layers each) have been stacked on the same planar composite structure (PCS) and connected in parallel. Such designs may, for example, increase the current capacity and efficiency of the respective phases of the stator, because the current for each phase can be carried along parallel paths within the respective subassemblies. FIG. 2 shows a selected view of a portion of a stator configuration having three six-layer subassemblies stacked in this manner, focusing on a single radial trace 204 as it is connected in parallel across eighteen conductive layers (using vias 210). On the last layer L18, two adjacent radial traces 204a, 204b are also shown as a visual guide. The parallel arrangement of radial traces 204 in the active region, connected by through-vias 210, affords the opportunity to arrange inner and outer turns and links (as in FIGS. 1A-C) across multiple conductive layers. Since these eighteen radial traces are in parallel, however, they can contribute to only a single turns structure.

Figure 3:
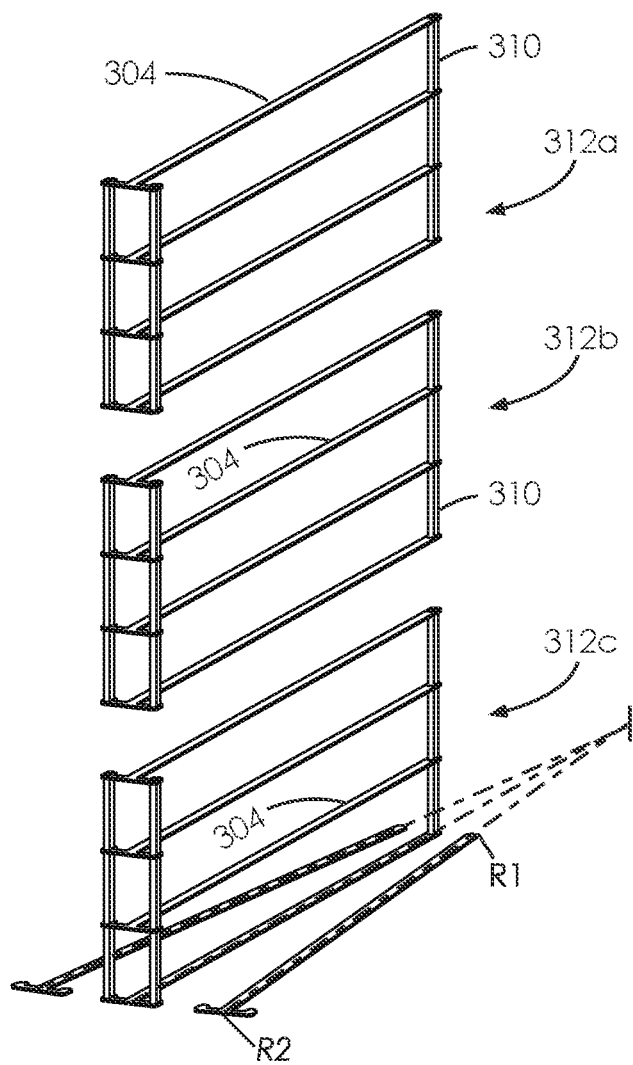
FIG. 3 shows radial traces at a single angular position, across twelve conductive layers of a PCS, organized in three parallel groups connected by blind or buried vias.

FIG. 3 shows a structure analogous to FIG. 2 but related to this disclosure. In particular, FIG. 3 shows radial traces 304 at a single angular position, across twelve conductive layers of a PCS. As shown, each radial trace 304 extends from a first radial distance R1 to a second radial distance R2 that is greater than the first radial distance R1. In this case, radial traces 304 are organized in three parallel groups 312a, 312b, 312c connected by blind or buried vias 310. For reasons of manufacture, it is most convenient for each of these groups to have a multiple of two conductive layers. Unlike a stator constructed according to the '625 patent, the respective parallel groups 312a, 312b, 312c of radial traces 304 can be connected in series, thus enabling a higher turns count for each coil of the stator. The turns count for the structure shown in FIG. 3, comprising three groups of parallel-connected radial traces, may, for example, be three times higher than the turns count for the structure shown in FIG. 2. An example of a stator implementation in which multiple parallel-connected groups of radial traces are connected in series in such a manner is described below in connection with FIGS. 12A, 12B, 13A, and 13B.

Figure 4:
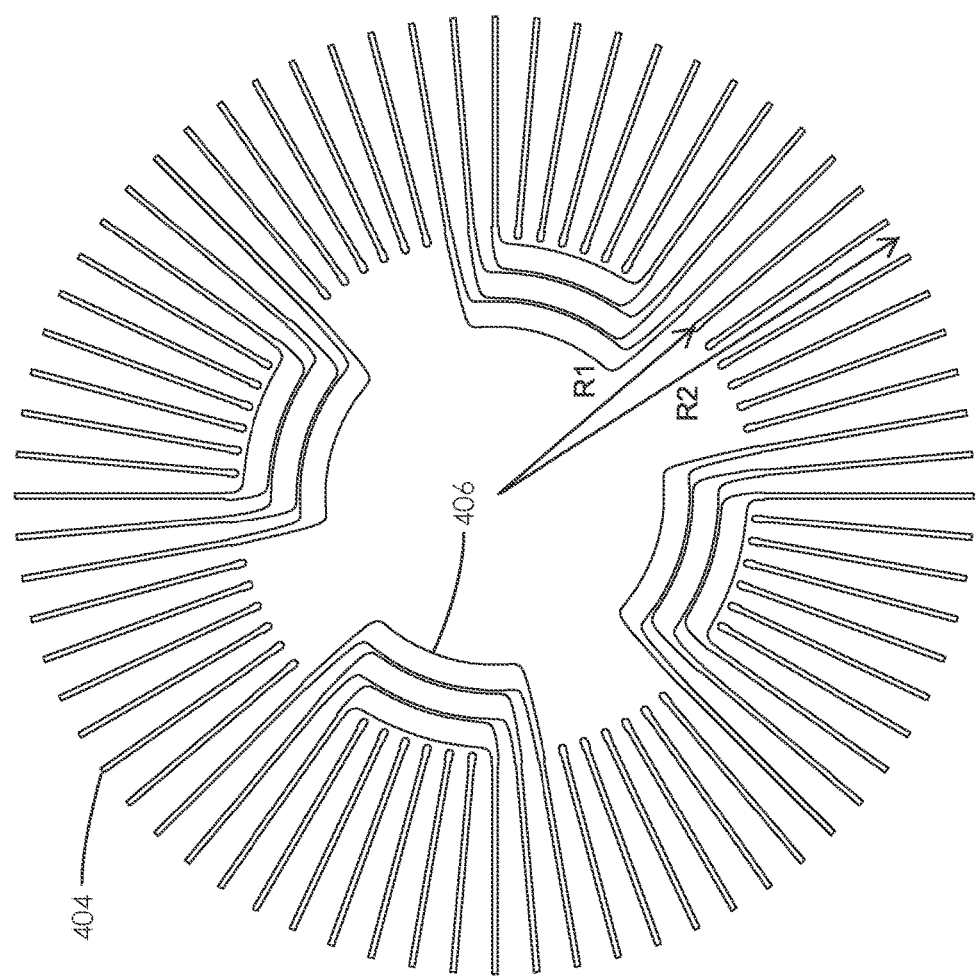
FIG. 4 shows inner end turns of the type described in the '625 patent, which are similar to the inner end turns shown in FIG. 1A.

FIG. 4 shows a plurality of radial traces 404 that each extends from a first radial distance R1 to a second radial distance R2 that is greater than the first radial distance R1, as well as inner end turns 402 of the type described in the '625 patent, which are similar to the inner end turns 102 shown in FIG. 1A. These inner end turns 402, together with outer end turns 606 (shown in FIG. 6), form all the connections between respective radial traces 404 that are needed to establish three-turns per pole pair of a single phase. Thus, in accordance with the '625 patent's teachings, one conductive layer including inner end turns 402 like those shown in FIG. 4 and outer end turns 606 like those shown in FIG. 6 (described below) is needed to connect a single phase. For a three-phase board constructed in accordance with this design, a minimum of three such conductive layers are needed.

Figure 5B:
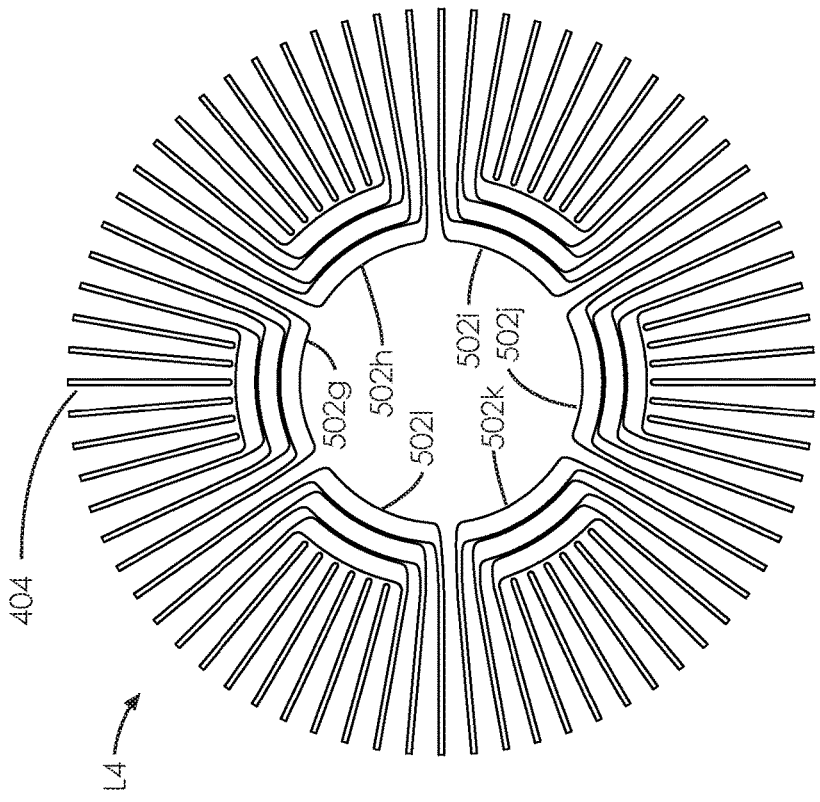
FIGS. 5A and 5B show an alternative arrangement of inner end turns on two respective conductive layers of a PCS.
Figure 5A:
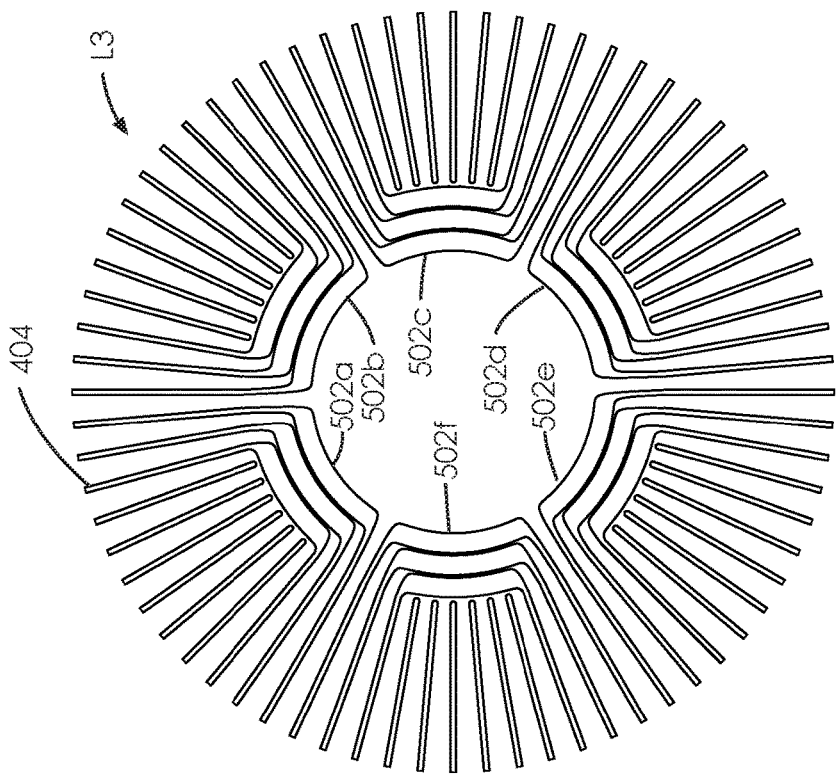

FIGS. 5A and 5B show an alternative arrangement of inner end turns 502 on two respective conductive layers L3, L4. It should be appreciated that the layer numbers used herein, e.g., "L3," are provided only to allow identification of the various layers being described and are not intended to imply an order in which various layers are positioned. In the arrangement illustrated, when radial traces 404 on layer L3 are connected in parallel with the corresponding (and parallel) radial traces 404 on layer L4, e.g., using vias (not shown in FIGS. 5A and 5B) similar to the vias 310 shown in FIG. 3, inner end turn connections for all of the radial traces 404 shown in FIGS. 5A and 5B can be established on just two conductive layers. As explained in more detail below, such an arrangement allows inner end turns 502 for multiple phases to be provided on the same conductive layer and also allows inner end turns 502 for the same phase to be distributed amongst multiple conductive layers. This is in contrast to the configuration of FIG. 4, where inner end turns 402 for only a single phase are provided on a given layer and inner end turns 402 for a given phase are all included on the same conductive layer.

In addition, as discussed in more detail below, in some implementations, either or both of layers L3 and L4 may additionally include outer end turns, which may, for example, be arranged similar to the outer end turns 606 illustrated in FIG. 6 (described below). Example embodiments of this type are described below in connection with FIGS. 10A, 10B, 11A, 11B, 12A, 12B, 13A, and 13B. Alternatively, outer end turns provided on layers L3 and L4 may be the same or similar to the outer end turns 706 described below in connection with FIGS. 7A and 7B. An example embodiment of the latter type is described below in connection with FIGS. 14, 15A, 15B, 15C, 16A, and 16B. Other configurations of outer end turns on either or both of layers L3 and L4, or even configurations in which all outer end turns are included on layers other than layers L3 and L4, are also possible and contemplated.

Two complementary sets of inner end turns 502 are shown in FIGS. 5A and 5B, with a first set of inner end turns 502a, 502b, 502c, 502d, 502e, and 502f being depicted on layer L3 in FIG. 5A and a second set of inner end turns 502g, 502h, 502i, 502j, 502k, 502l being depicted on layer L4 in FIG. 5B. By comparing these complementary connections, and appreciating that inner end turns 502 for multiple phases can be provided on the same conductive layer and that inner end turns 502 for a given phase can be distributed amongst multiple conductive layers, it is evident that all the inner end turn connections required for a three-phase stator can be achieved in just the two layers L3 and L4 illustrated. For example, a first phase can be supported by inner end turns 502a and 502d on layer L3 in FIG. 5A and inner end turns 502h and 502k on layer L4 in FIG. 5B, a second phase can be supported by inner end turns 502b and 502e on layer L3 in FIG. 5A and inner end turns 502i and 502l on layer L4 in FIG. 5B, and a third phase can be supported by inner end turns 502c and 502f on layer L3 in FIG. 5A and inner end turns 502g and 502j on layer L4 in FIG. 5B. In such an implementation, since the inner end turns 502 for each phase consume one-third of layer L3 and one-third of layer L4, the inner end turns 502 for each phase consume a total of two-thirds of a layer worth of real estate on the layers L3 and L4. In the example implementation shown, moreover, two conductive layers minimum are needed to form complete inner end turn connections for all three phases, and the conductive layer count should be a multiple of two in order for the stator to be balanced with respect to the inner end turns.

Further, it should be noted that, with the example configuration shown in FIGS. 5A and B, because there are a total of twelve end turn groups 502a-502l available to establish respective poles, each phase of a three-phase stator employing such a configuration should preferably have four poles. In other words, for a densely-packed inner end turn configuration like that shown in FIGS. 5A and B, the following equation is preferably satisfied for a three phase stator (where "k" is an integer):

$$4*k=3*\text{poles}$$

Figure 6:
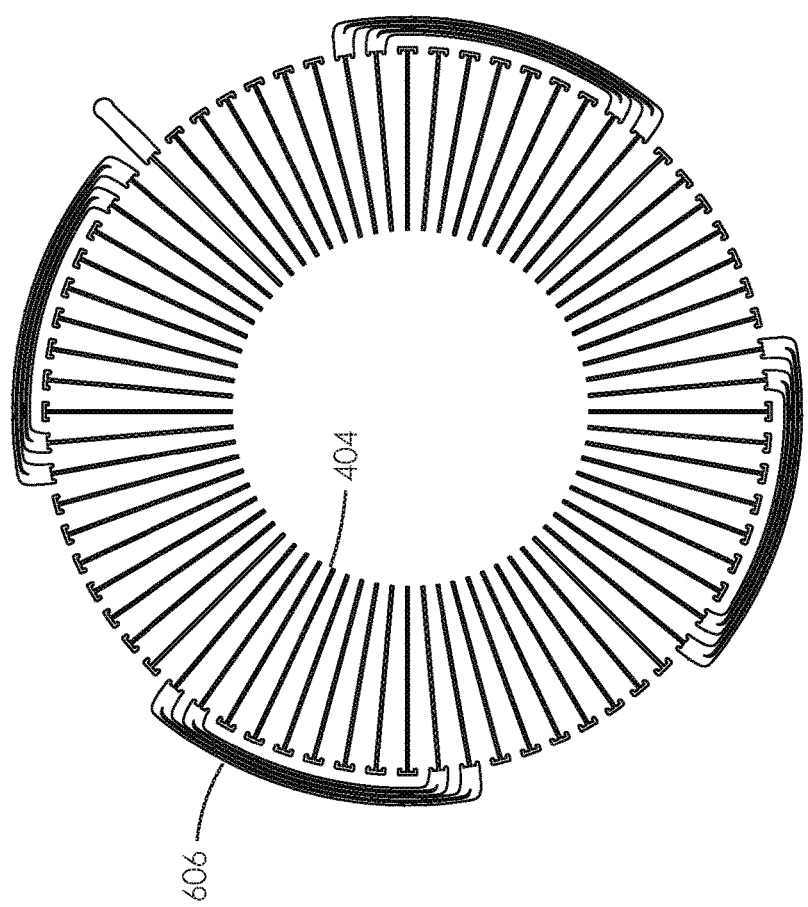
FIG. 6 shows outer end turns of the type described in the '625 patent, which are similar to the outer end turns shown in FIG. 1A.

FIG. 6 shows outer end turns 606 of the type described in the '625 patent, which are similar to the outer end turns 106 shown in FIG. 1A. These outer end turns 606, together with inner end turns 402 (shown in FIG. 4), form all the connections between respective radial traces 404 that are needed to establish three-turns per pole pair of a single phase. Thus, in accordance with the '625 patent's teachings, one layer including both outer end turns 606 like those shown in FIG. 6 and inner end turns 402 like those shown in FIG. 4 is needed to connect a single phase. For a three-phase board constructed in accordance with this design, a minimum of three such conductive layers are needed.

Similar to FIGS. 5A and 5B, FIGS. 7A and 7B show an alternative arrangement of outer end turns 706 on two respective conductive layers L5, L6. In the arrangement illustrated, when radial traces 404 on layer L5 are connected in parallel with the corresponding (and parallel) radial traces 404 on layer L6, e.g., using vias (not shown in FIGS. 7A and 7B) similar to the vias 310 shown in FIG. 3, outer end turn connections for all of the radial traces 404 shown in FIGS. 7A and 7B can be established on just two layers. As explained in more detail below, such an arrangement allows outer end turns 706 for multiple phases to be provided on the same conductive layer and also allows outer end turns 706 for the same phase to be distributed amongst multiple conductive layers. This is in contrast to the configuration of FIG. 6, where outer end turns 606 for only a single phase are provided on a given conductive layer and outer end turns 606 for a given phase are all included on the same conductive layer.

In addition, as discussed in more detail below, in some implementations, either or both of layers L5 and L6 may additionally include inner end turns, which may, for example, be arranged similar to the inner end turns 402 illustrated in FIG. 4. Alternatively, inner end turns provided on layers L5 and L6 may be the same or similar to the inner end turns 502 described above in connection with FIGS. 5A and 5B. An example embodiment of the latter type is described below in connection with FIGS. 14, 15A, 15B, 15C, 16A, and 16B. Other configurations of inner end turns on either or both of layers L5 and L6, or even configurations in which all inner end turns are included on layers other than layers L5 and L6, are also possible and contemplated.

No matter the implementation, it should be appreciated that some mechanism will need be used to somehow get current to the respective phases. In the example illustrated in FIGS. 7A and 7B this is accomplished by configuring outer end turn groups 706b, 706c, and 706h differently than the other outer end groups to establish inputs 708a, 708b, and 708c to respective winding circuits. In other implementations, current may additionally or alternatively be introduced to one or more of the phases in some other manner, such as from one or more other conductive layers, e.g., using vias/solder pads/pressure contacts or pins to dedicated connection layers, connecting wires directly to the pads inside the outer end turns 706, or another similar technique.

Further, it should be appreciated that, in some implementations, current may additionally or alternatively be fed to respective phases from the inner region of the stator, with one or more inner end turn groups 402, 502 like those shown in FIGS. 4 and 5 being configured differently than the other inner end turn groups to allow for inputs similar to inputs 708a, 708b, and/or 708c, but instead being located in the inner region of the stator. Moreover, in some implementations, rather than having a shaft running through the middle region of the stator, a rotor may instead run "outside" the stator, e.g., an annular or tubular rotor structure could surround and rotate about the stator. Such an implementation may make sense, for example, in an embodiment in which current is fed to respective phases from the inner region of the stator.

Figures 7A, 7B:
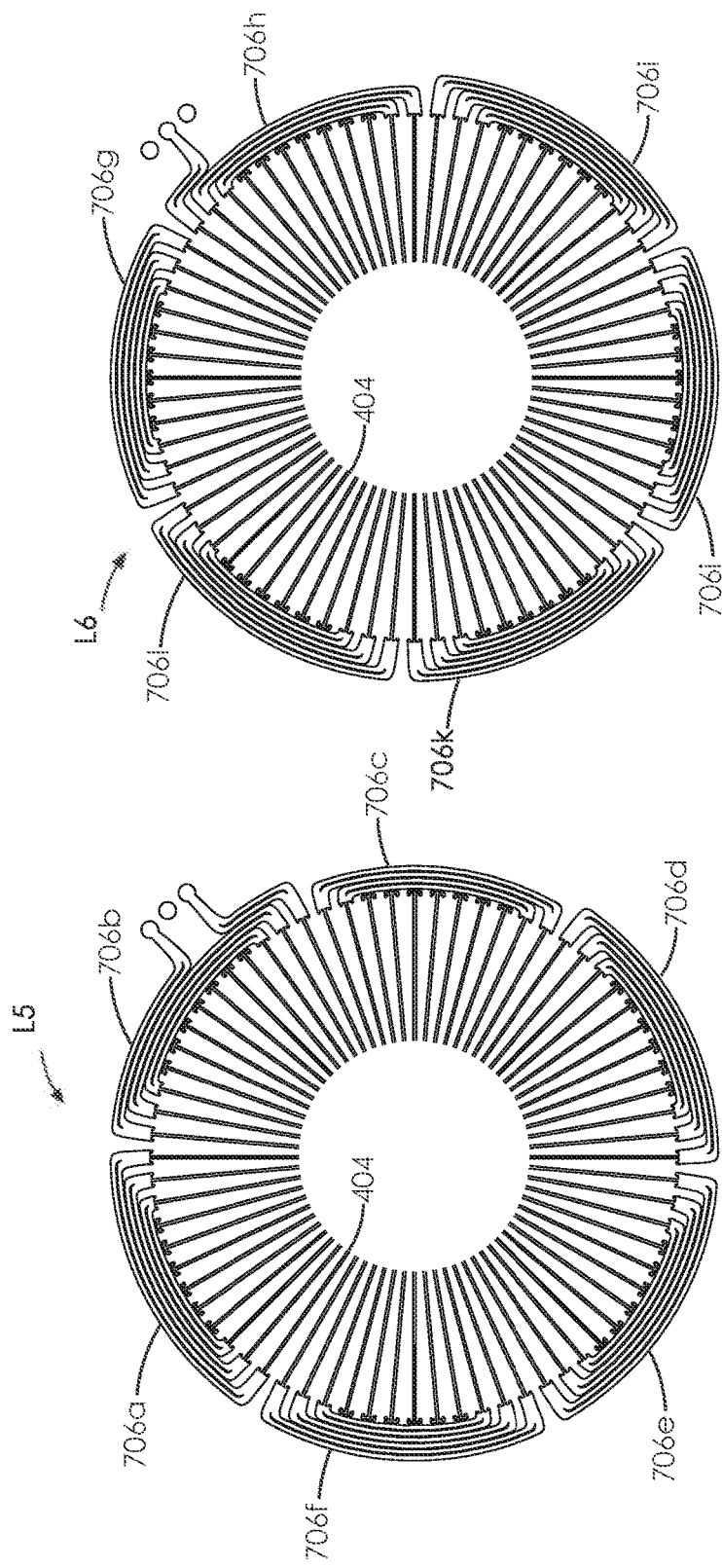
FIGS. 7A and 7B show an alternative arrangement of outer end turns on two respective conductive layers of a PCS.

Two complementary sets of outer end turns 706 are shown in FIGS. 7A and 7B, with a first set of outer end turns 706a, 706b, 706c, 706d, 706e, and 706f being depicted on layer L5 in FIG. 7A and a second set of outer end turns 706g, 706h, 706i, 706j, 706k, and 706l being depicted on layer L6 in FIG. 7B. By comparing these complementary connections, and appreciating that outer end turns 706 for multiple phases can be provided on the same conductive layer and that outer end turns 706 for a given phase can be distributed amongst multiple conductive layers, it is evident that all the outer end turn connections required for a three-phase stator can be achieved in just the two layers L5 and L6 illustrated. For example, a first phase can be supported by outer end turns 706a and 706d on layer L5 in FIG. 7A and outer end turns 706h and 706k on layer L6 in FIG. 7B, a second phase can be supported by outer end turns 706b and 706e on layer L5 in FIG. 7A and outer end turns 706i and 706l on layer L6 in FIG. 7B, and a third phase can be supported by outer end turns 706c and 706f on layer L5 in FIG. 7A and outer end turns 706g and 706j on layer L6 in FIG. 7B. In such an implementation, since the outer end turns 706 for each phase consume one-third of layer L5 and one-third of layer L6, the outer end turns 706 for each phase consume a total of two-thirds of a layer worth of real estate on the layers L5 and L6. In the example implementation shown, moreover, two conductive layers minimum are needed to form complete outer end turn connections for all three phases, and the conductive layer count should be a multiple of two in order for the stator to be balanced with respect to the outer end turns.

Figure 8:
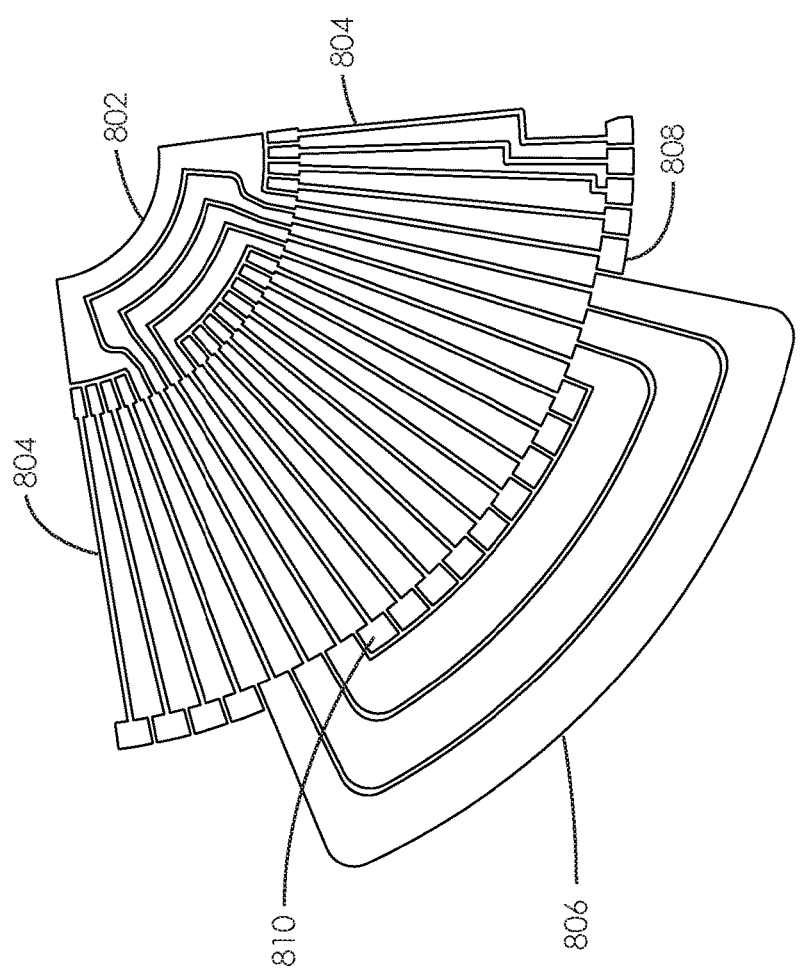
FIG. 8 shows inner end turns and outer end turns that interconnect radial traces to form a single coil of a stator in accordance with the winding layout taught by the '625 patent.

FIG. 8 shows inner end turns 802 and outer end turns 806 that interconnect radial traces 804 to form a single coil of a stator in accordance with the winding layout taught by the '625 patent. The coil illustrated can be seen to either begin at a point 808 and spiral "in" to the point 810, or begin at the point 810 and spiral "out" to the point 808. Note that, in this structure, there are four inner end turns 802 but only three outer end turns 806. The "missing" outer end turn 806 cannot be routed on the same layer as the other turns, because it needs to establish a connection from the inside of the spiral (e.g., point 810) to the outside of the next spiral, or vice versa. As this type of connection proceeds around the stator, it encircles the center point of the stator only once.

Figure 9:
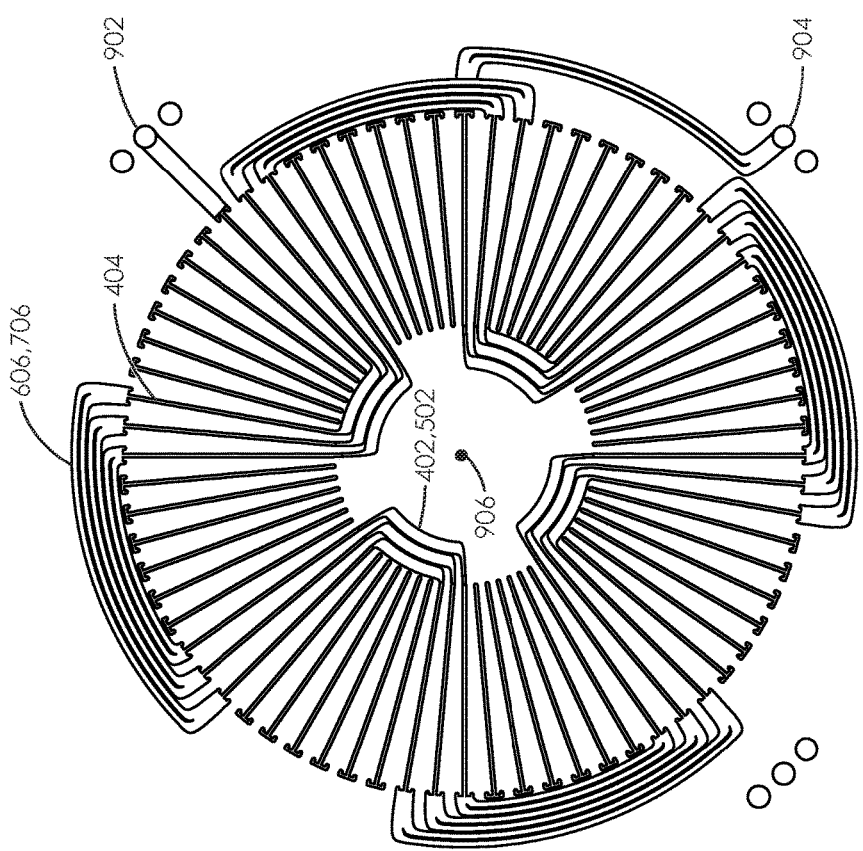
FIG. 9 shows an alternate arrangement of inner and outer end turns for a single phase in a plan view of multiple layers.

FIG. 9 shows an alternate arrangement of inner and outer end turns for a single phase in a plan view of multiple conductive layers. Three turns are effected in the layers shown. In some implementations, inner end turns 502 like those shown in FIGS. 5A and 5B may be employed, and those inner end turns 502 may be distributed across two (or more) conductive layers. In some implementations, for example, the inner end turns illustrated in FIG. 9 may include two groups of inner end turns 502 from one layer (e.g., inner end turns 502b and 502e on layer L3 shown in FIG. 5A) and two groups of inner end turns 502 from another layer (e.g., inner end turns 502i and 502l on layer L4 shown in FIG. 5B). As discussed above in connection with FIGS. 5A and 5B, the use of inner end turns 502 from two or more conductive layers can enable the formation of a complete set of inner end turn connections for a single phase. Alternatively, in some implementations, some or all of the inner end turns illustrated in FIG. 9 may be of the type shown in FIG. 4, i.e., like inner end turns 402, and may be disposed in a common conductive layer.

In some implementations, some or all of the outer end turns shown in FIG. 9 may be of the type shown in FIG. 6, i.e., like outer end turns 606, and may be disposed in a common conductive layer. Alternatively, some or all of the outer end turns illustrated may be of the type shown in FIG. 7, i.e., like outer end turns 706, and may be distributed across two (or more) conductive layers. In some implementations, for example, the outer end turns illustrated in FIG. 9 may include two groups of outer end turns 706 from one conductive layer (e.g., outer end turns 706a and 706d on layer L5 shown in FIG. 7A) and two groups of outer end turns 706 from another conductive layer (e.g., outer end turns 706h and 706k on layer L6 shown in FIG. 7B). As discussed above in connection with FIGS. 7A and 7B, the use of outer end turns 706 from two or more conductive layers can enable the formation of a complete set of outer end turn connections for a single phase.

No matter the implementation, it should be appreciated that, in contrast to FIG. 8, for most of the end turn groups, the number of turns within a given group of outer end turns 606, 706 equals the number of turns within an adjacent group of inner end turns 402, 502, and vice versa. Tracing the connections from upper right terminal 902, the radial traces 404, inner end turns 402, 502, and outer end turns 606, 706 form a serpentine pattern that is capable of being routed in a single conductive layer. In the implementation shown in FIG. 8, by contrast, only unconnected windings could be routed in a single conductive layer. As shown in FIG. 9, the serpentine pattern that begins at terminal 902 and ends at terminal 904 encircles a center point 906 of the stator three times (or turns).

FIGS. 10A, 10B, 11A, 11B, 12A, 12B, 13A, and 13B illustrate example embodiments of stators that employ serpentine windings like that shown in FIG. 9, and in which inner end turns 502 of the type shown in FIGS. 5A and B and outer end turns 606 of the type shown in FIG. 6 are employed to establish winding connections for one or more subassemblies that each includes four conductive layers. Features of a single such subassembly S1 is illustrated in FIGS. 10A, 10B, 11A, and 11B, and features a stacked set of three such subassemblies S1, S2, and S3 are illustrated in FIGS. 12A, 12B, 13A, and 13B. In the example shown in these figures, for each subassembly S1, S2, and S3 that is illustrated, each of the radial connectors 404 on a given conductive layer of that subassembly is connected to corresponding (and parallel) ones of the radial connectors 404 in the other conductive layers of that same subassembly using vias 310, in the manner illustrated in FIG. 3. An illustrative technique for forming multi-layer PCS assemblies/subassemblies like those shown is described below in connection with FIGS. 17A and 17B.

Figure 10A:
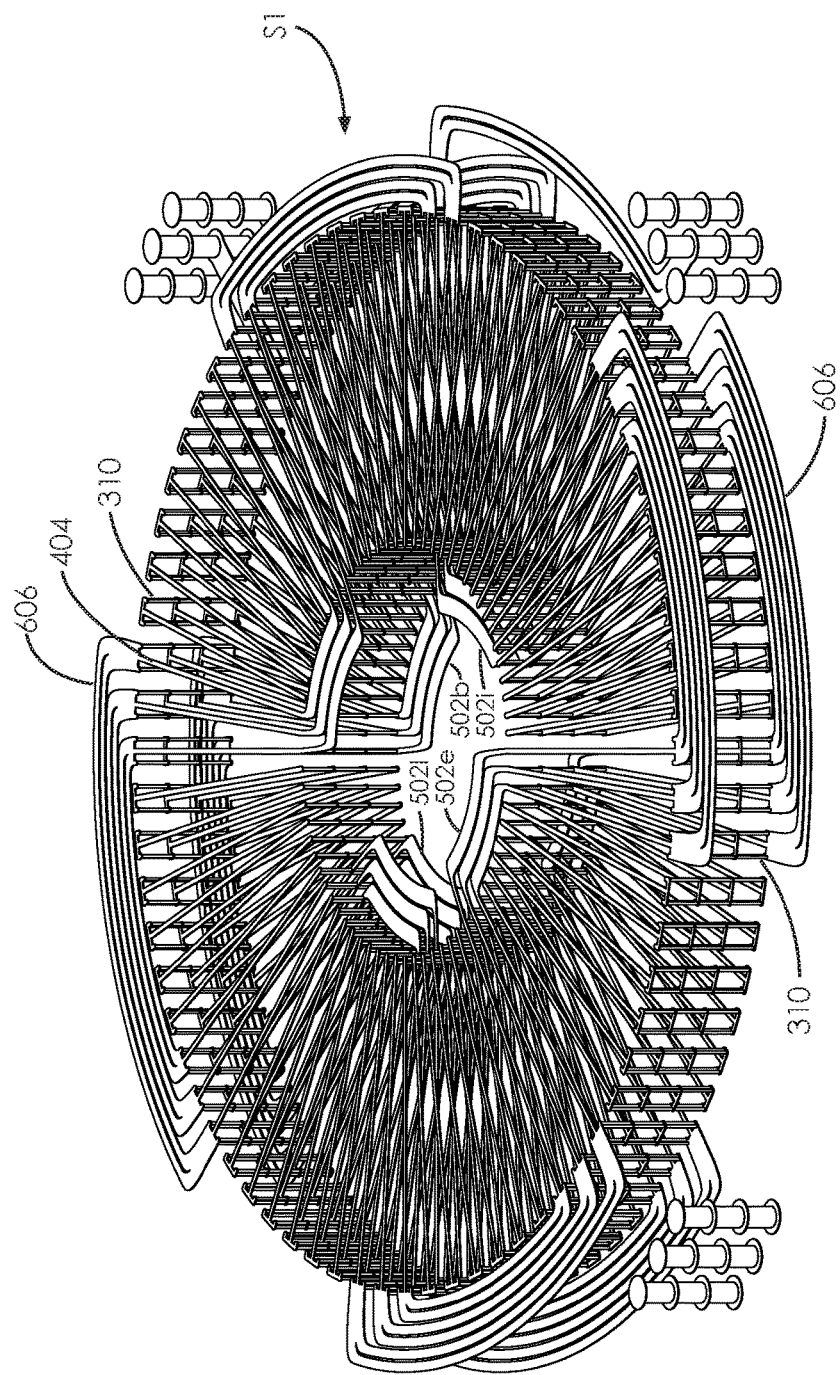
FIG. 10A shows an expanded (in the z-axis) perspective view of a subassembly including four conductive layers, with inner end turns and outer end turns corresponding to a selected phase for clarity.
Figure 10B:
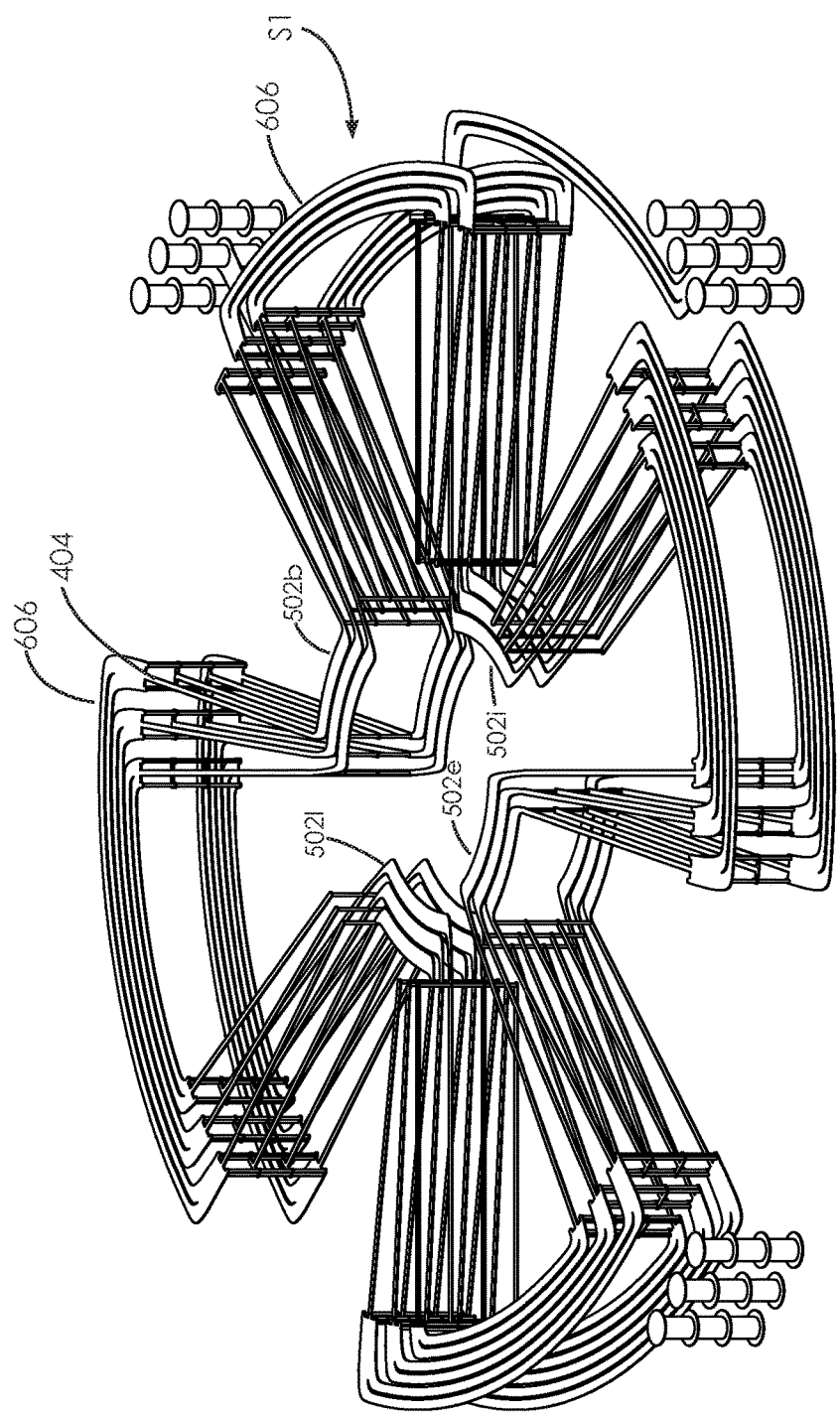
FIG. 10B illustrates the positions of inner end turns and outer end turns for a first phase within the subassembly shown in FIG. 10A.
Figure 11A:
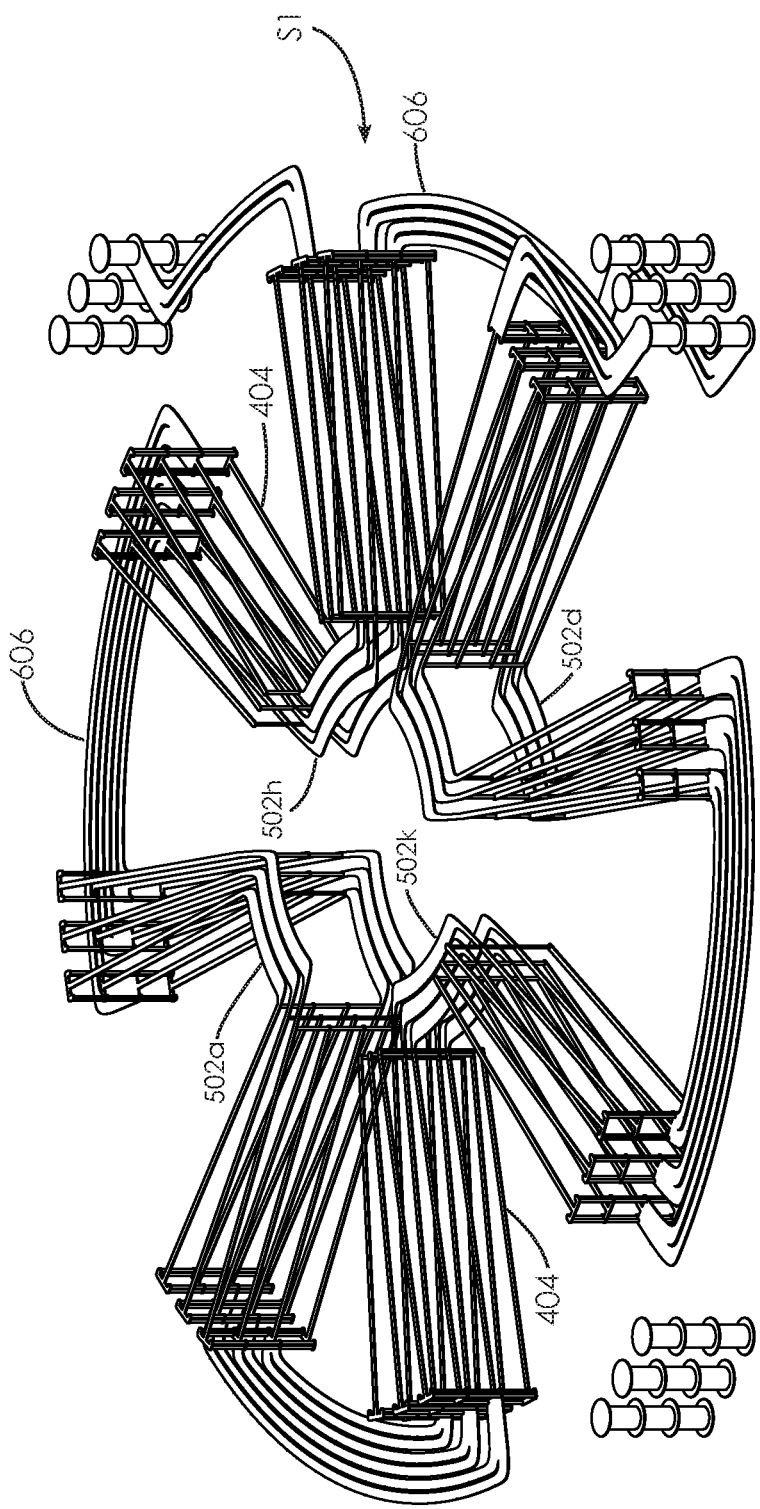
FIG. 11A illustrates the positions of inner end turns and outer end turns for a second phase within the subassembly shown in FIG. 10A.
Figure 11B:
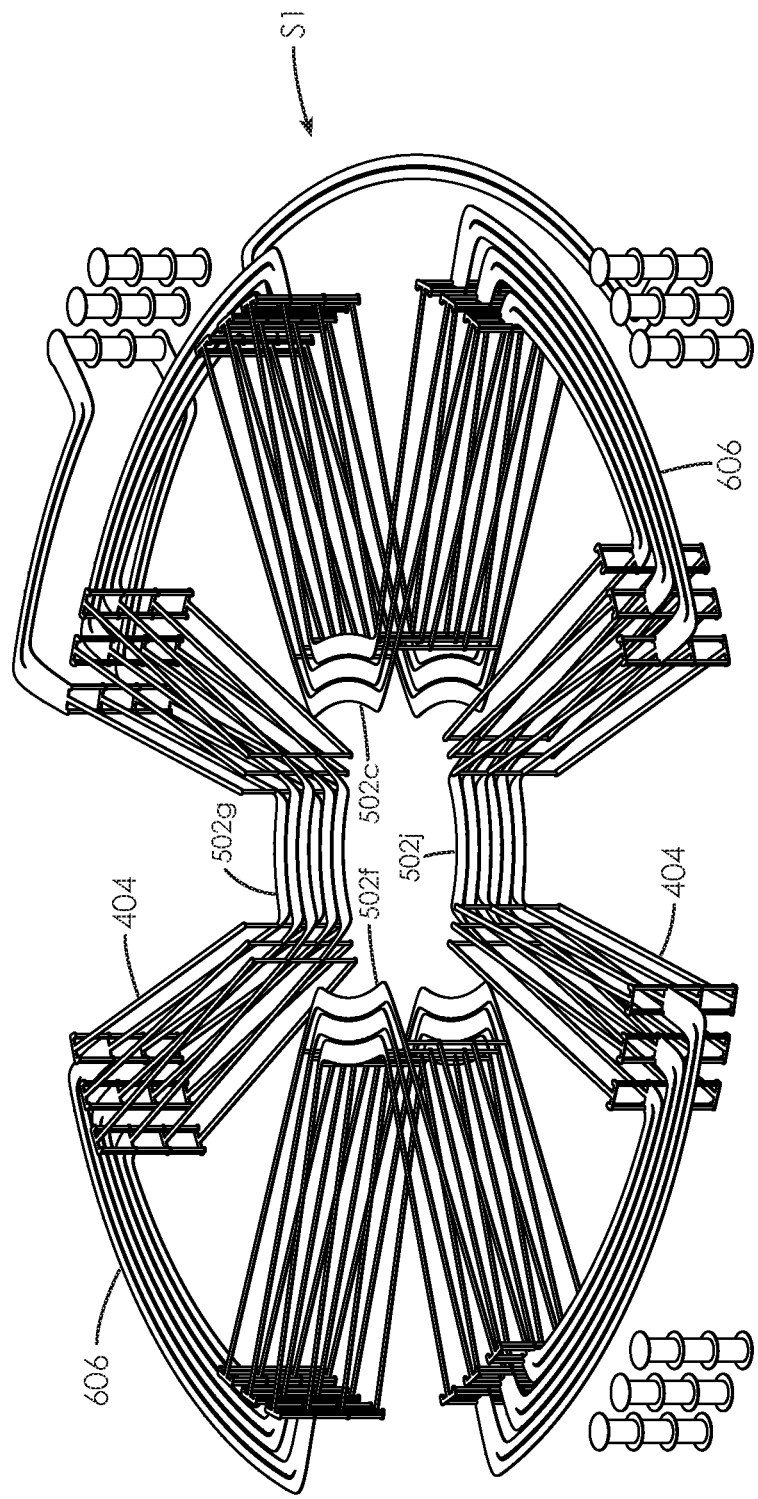
FIG. 11B illustrates the positions of inner end turns and outer end turns for a third phase within the subassembly shown in FIG. 10A.

FIG. 10A shows an expanded (in the z-axis) perspective view of a subassembly S1 having four conductive layers, with inner end turns 502b, 502e, 502i, 502l and outer end turns 606 corresponding to a selected phase for clarity. The positions of additional inner end turns 502 and outer end turns 606 that can be incorporated into the structure of FIG. 10A to establish the other two phases of a three phase stator are illustrated in FIGS. 11A-11B below. FIG. 10B is similar to FIG. 10A but, for illustration purposes, has further portions of the subassembly S1 corresponding to the other two phases removed. FIG. 10B thus illustrates how the windings for a single phase of a three phase stator can make their way through a subassembly S1 having four conductive layers.

Similar to FIG. 10B, FIGS. 11A-11B illustrate how the windings of the two remaining phases may work their way through the subassembly S1 shown in FIG. 10A, with the portions of the subassembly corresponding to the other two phases removed for illustration purposes. Accordingly, FIG. 10B illustrates the positions of inner end turns 502b, 502e, 502i, 502l and outer end turns 606 for a first phase within the subassembly S1, FIG. 11A illustrates the positions of inner end turns 502a, 502d, 502h, 502k and outer end turns 606 for a second phase within the subassembly S1, and FIG. 11B illustrates the positions of inner end turns 502c, 502f, 502g, 502j and outer end turns 606 for a third phase within the subassembly S1.

Inner end turns 502b, 502e, 502i, 502l for the first phase illustrated FIGS. 10A and 10B appear with multiplicity two over four conductive layers, with the inner end turns 502b and 502e appearing on two of the four illustrated layers and inner end turns 502i and 502l appearing on remaining two layers. The same is also true of the inner end turns 502 for the other two phases illustrated in FIGS. 11A and 11B. That is, for second the phase illustrated in FIG. 11A, the inner end turns 502a, 502d, 502h, 502k appear with multiplicity two over the four layers, with the inner end turns 502a and 502d appearing on two of the four illustrated layers and inner end turns 502h and 502k appearing on remaining two layers, and for the third phase illustrated in FIG. 11B, the inner end turns 502c, 502f, 502g, 502j appear with multiplicity two over the four layers, with the inner end turns 502c and 502f appearing on two of the four illustrated layers and inner end turns 502g and 502j appearing on remaining two layers. Accordingly, for all three phases of the subassembly S1 shown in FIGS. 10A, 10B, 11A and 11B, the inner end turns 502 appear with multiplicity two over four conductive layers and are balanced (equal for each phase) because the subassembly S1 has a multiple of two conductive layers.

For the particular phase shown in FIGS. 10A and 10B, i.e., the first phase, the outer end turns 606 also appear with multiplicity two over the four layers illustrated. For that phase, the outer end turns 606 occupy two of four conductive layers. The outer end turns 606 for the other two phases (shown in FIGS. 11A and 11B) are on the other two conductive layers, but without redundancy. That is, the outer end turns 606 for the second phase (shown in FIG. 11A) appear on only a single conductive layer, as do the outer end turns 606 for the third phase (shown in FIG. 11B). Thus, the subassembly S1 shown in FIGS. 10A, 10B, 11A and 11B has all the connections required of a three-phase stator, but is unbalanced because of the unequal redundancy of outer end turns 606 over the phases.

Figure 12A:
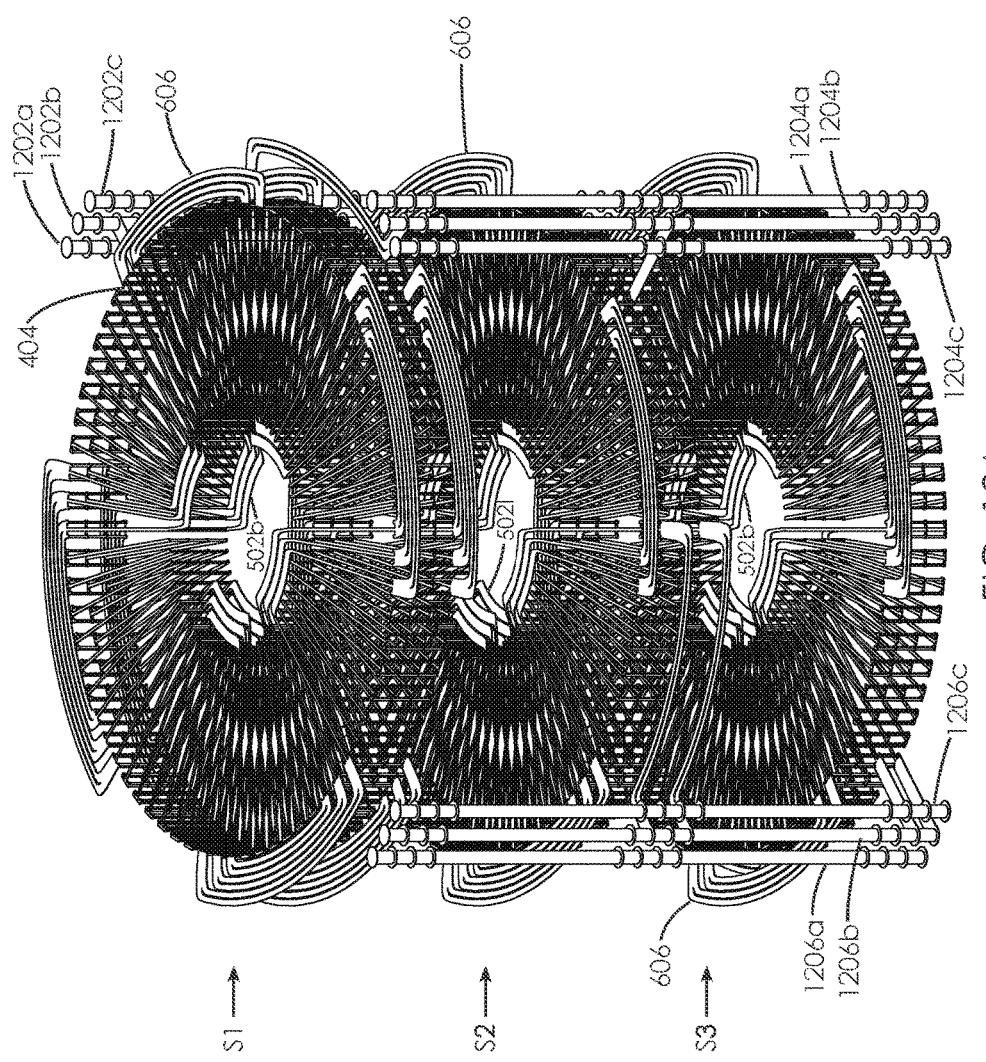
FIG. 12A shows an expanded (in the z-axis) perspective view of an assembly of three subassemblies, each similar to the subassembly shown in FIG. 10A.

FIG. 12A shows an expanded (in the z-axis) perspective view of an assembly of three subassemblies S1, S2, and S3, each similar to the subassembly shown in FIG. 10A. In some embodiments, two or more such respective subassemblies may be laminated together to form a single PCS. As in FIG. 10A, FIG. 12A shows inner end turns 502 and outer end turns 606 associated with only one of three phases for clarity. The positions of additional inner end turns 502 and outer end turns 606 that can be incorporated into the structure of FIG. 12A to establish the other two phases of a three phase stator are illustrated in FIGS. 13A-13B below.

Figure 12B:
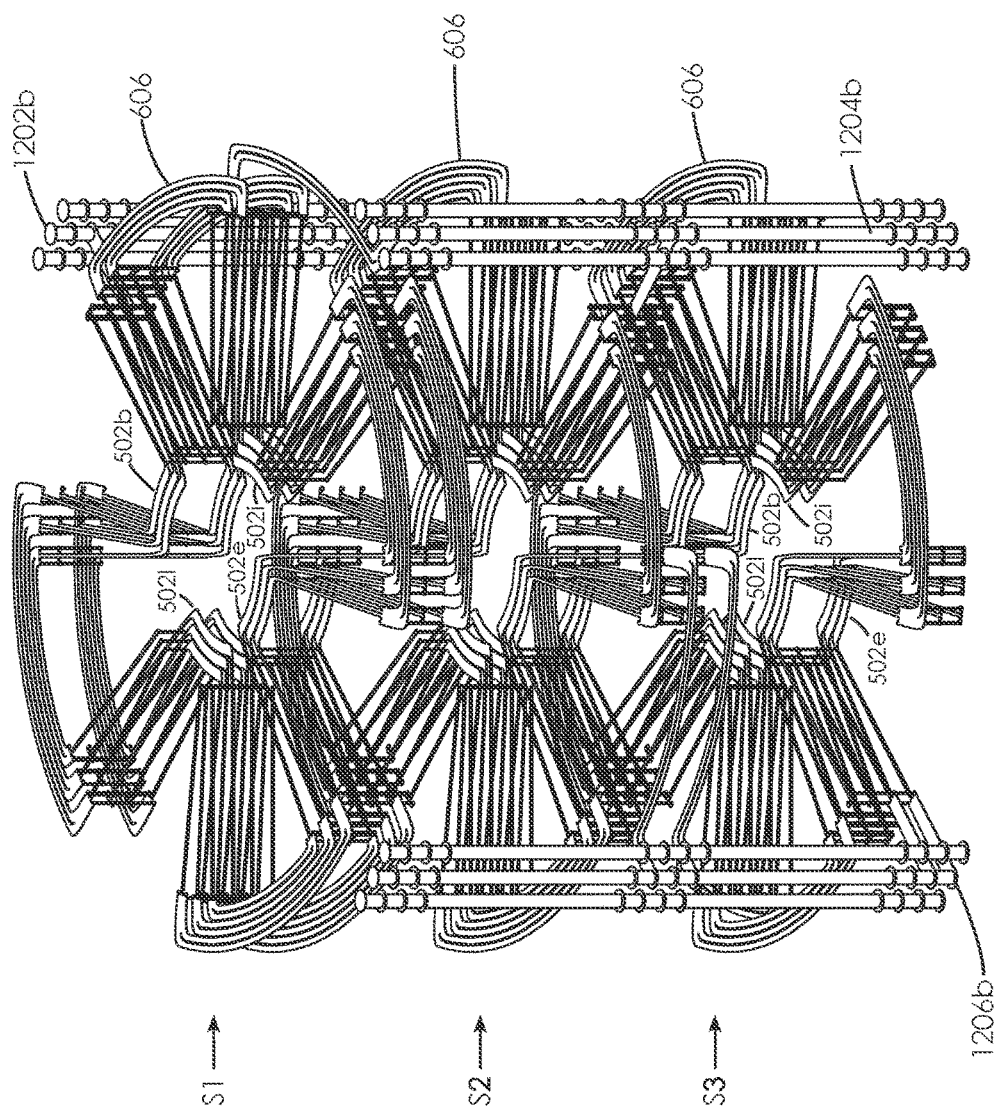
FIG. 12B illustrates the positions of inner end turns and outer end turns for a first phase within the stack of three subassemblies shown in FIG. 12A.

FIG. 12B is similar to FIG. 12A but, for illustration purposes, has further portions of the subassemblies S1, S2, and S3 corresponding to the other two phases removed. FIG. 12B thus illustrates how the windings for a single phase of a three phase stator can make their way through a stacked set of three subassemblies S1, S2, and S3, with each subassembly having four conductive layers. The subassemblies S1, S2, S3 may be electrically connected, either in parallel or in series, by through-vias 1202a, 1202b, 1202c, 1204a, 1204b, 1204c, 1206a, 1206b, and 1206c. In the example shown, windings of the three subassemblies S1, S2, and S3 are connected in series so that the turn count for each phase of the entire assembly is three times greater than the turn count of any one of the individual subassemblies S1, S2, and S3.

The manner in which current may flow through and between the windings of the subassemblies S1, S2, and S3 for the phase illustrated in FIG. 12B will now be explained. Although not separately described, it should be appreciated that similar paths may be followed for the windings of the other two phases (shown in FIGS. 13A and 13B—described below), but using different groups of the through-vias 1202, 1204, and 1206. For the phase illustrated in FIG. 12B, current may flow into the windings of the subassembly S1 from the through-via 1202b. The current may then exit the windings of the subassembly S1 via conductive trace 1208. Current from the conductive trace 1208 may then flow through through-via 1204b to conductive trace 1210, where it may enter the windings of the subassembly S2. The current may then exit the windings of subassembly S2 via conductive traces 1212a and 1212b. Current from the conductive traces 1212a, 1212b may then flow through through-via 1206b to conductive traces 1214a and 1214b, where it may enter the windings of the subassembly S3. The current may then exit the windings of subassembly S3 and flow to a neutral conductor, along with currents from the other two phases (shown FIGS. 13A and 13B).

Figure 13B:
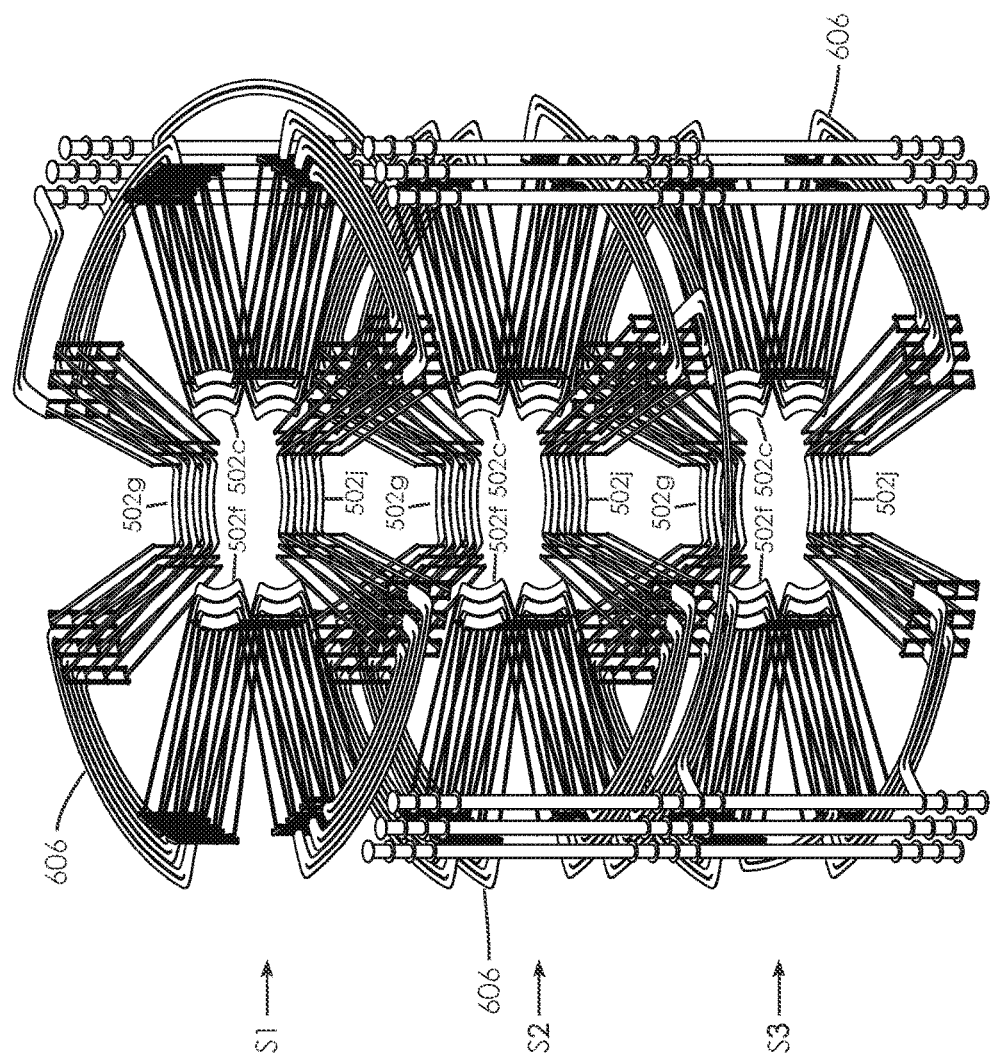
FIG. 13B illustrates the positions of inner end turns and outer end turns for a third phase within the stack of three subassemblies shown in FIG. 12A.

Similar to FIG. 12B, FIGS. 13A-13B illustrate how the windings of the two remaining phases may work their way through the three subassemblies S1, S2, and S3 shown in FIG. 12A, with the portions of the subassemblies corresponding to the other two phases removed for illustration purposes. Accordingly, FIG. 12B illustrates the positions of inner end turns 502b, 502e, 502i, and 502l and outer end turns 606 for a first phase within the stack of three subassemblies S1, S2, and S3, FIG. 13A illustrates the positions of inner end turns 502a, 502d, 502h, and 502k and outer end turns 606 for a second phase within the stack of three subassemblies S1, S2, and S3, and FIG. 13B illustrates the positions of inner end turns 502c, 502f, 502g, and 502j and outer end turns 606 for a third phase within the stack of three subassemblies S1, S2, and S3.

Each subassembly S1, S2, and S3 comprises four conductive layers, like FIG. 10A, but the layer with outer end turns 606 of multiplicity two in each subassembly is different. Thus, for the phase illustrated in FIGS. 12A and 12B, the top subassembly S1 has two parallel layers of outer end turns 606, but the other two subassemblies S2 and S3 do not; for the phase illustrated in FIG. 13A, the bottom subassembly S3 has two parallel layers of outer end turns 606, but the other two subassemblies S1 and S2 do not; and for the phase illustrated in FIG. 13B, the middle subassembly S2 has two parallel layers of outer end turns 606, but the other two subassemblies S1 and S3 do not. Accordingly, the stacked assembly shown by the combination of FIGS. 12A, 12B, 13A and 13B is arranged so that each of the three phases has the same number of parallel and series connected layers of outer turns 606, in addition to having the same number of parallel and series connected layers of inner end turns 502, thus making the overall assembly balanced.

FIGS. 14, 15A, 15B, 15C, 16A, and 16B illustrate an example embodiment of a stator that employs serpentine windings like that shown in FIG. 9, and in which inner end turns 502 of the type shown in FIGS. 5A and B and outer end turns 706 of the type shown in FIGS. 7A and 7B are employed to establish all of the winding connections needed for three phases in an assembly that includes just two conductive layers. In the example shown in these figures, each of the radial connectors 404 on the upper conductive layer is connected to a corresponding (and parallel) radial connector 404 in the lower conductive layer using vias 1410, which are similar to the vias 310 shown in FIG. 3.

Figure 14:
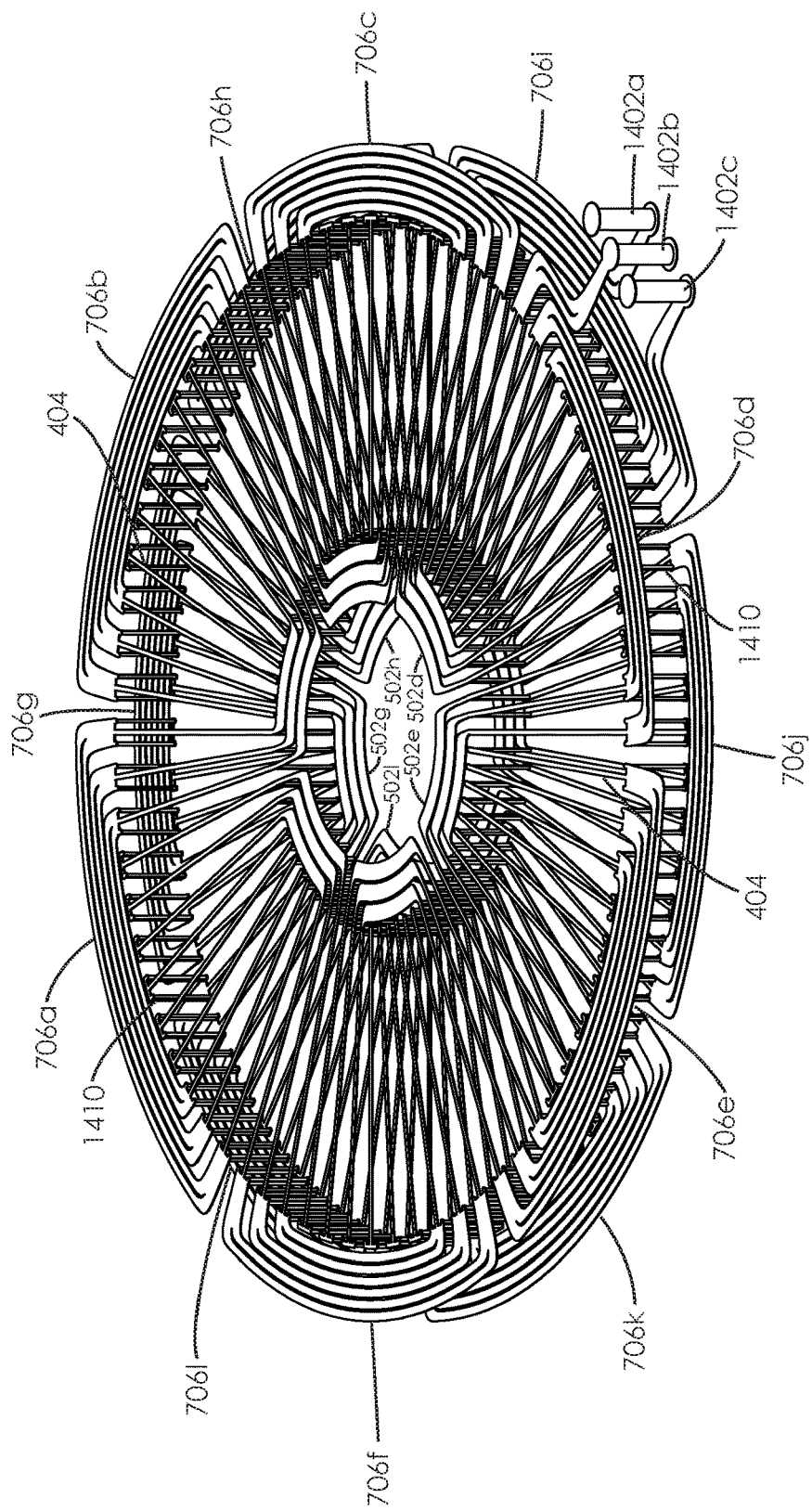
FIG. 14 shows an expanded (in the z-axis) perspective view an example embodiment of a stator that employs serpentine windings like that shown in FIG. 9, and in which inner end turns of the type shown in FIGS. 5A and B and outer end turns of the type shown in FIGS. 7A and 7B are employed to establish all of the winding connections needed for three phases in an assembly that includes just two conductive layers.
Figure 15A:
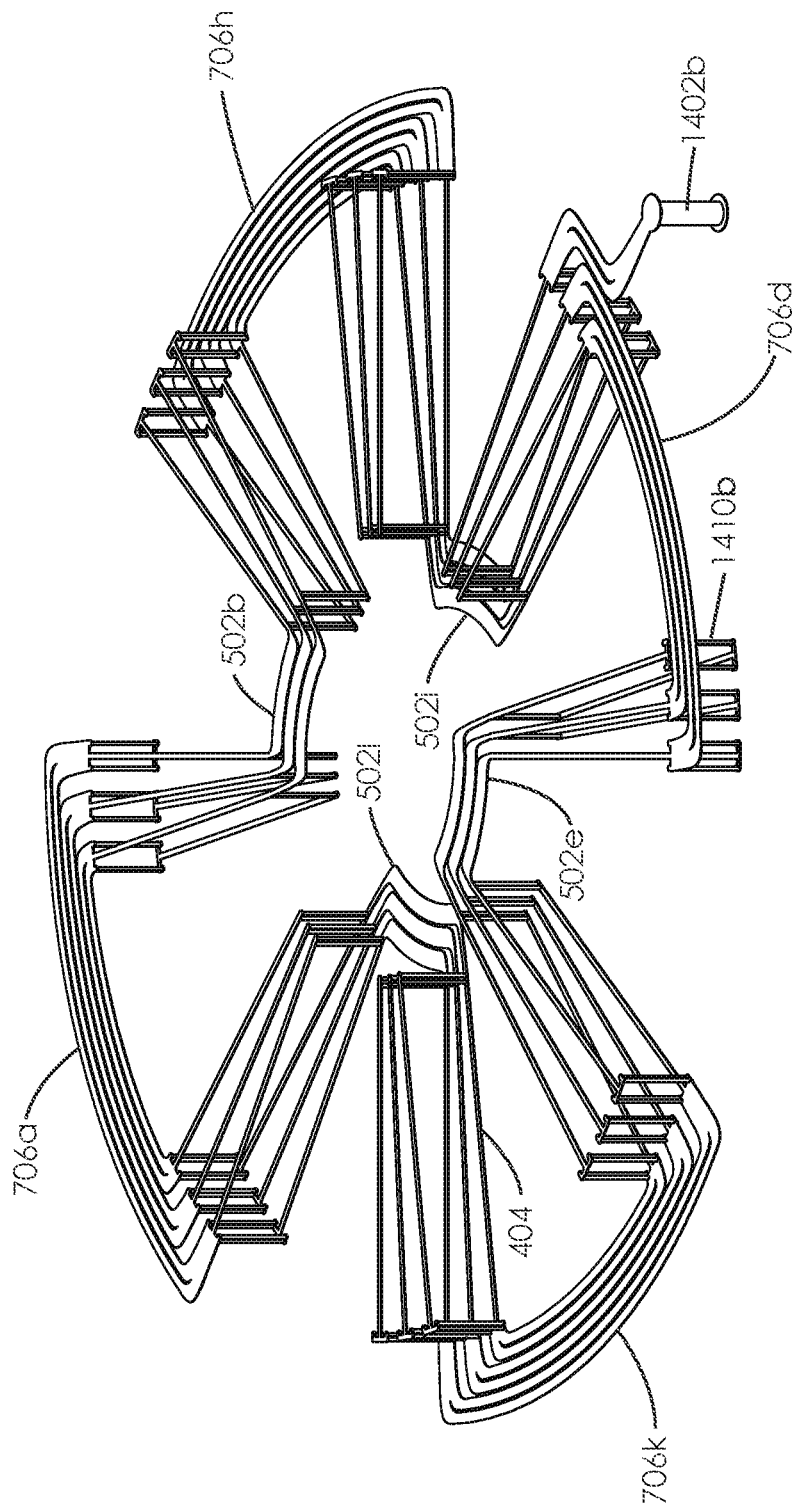
FIG. 15A shows an expanded (in the z-axis) perspective view of only the portions of the assembly shown in FIG. 14 that correspond to a first phase of the stator.
Figure 15C:
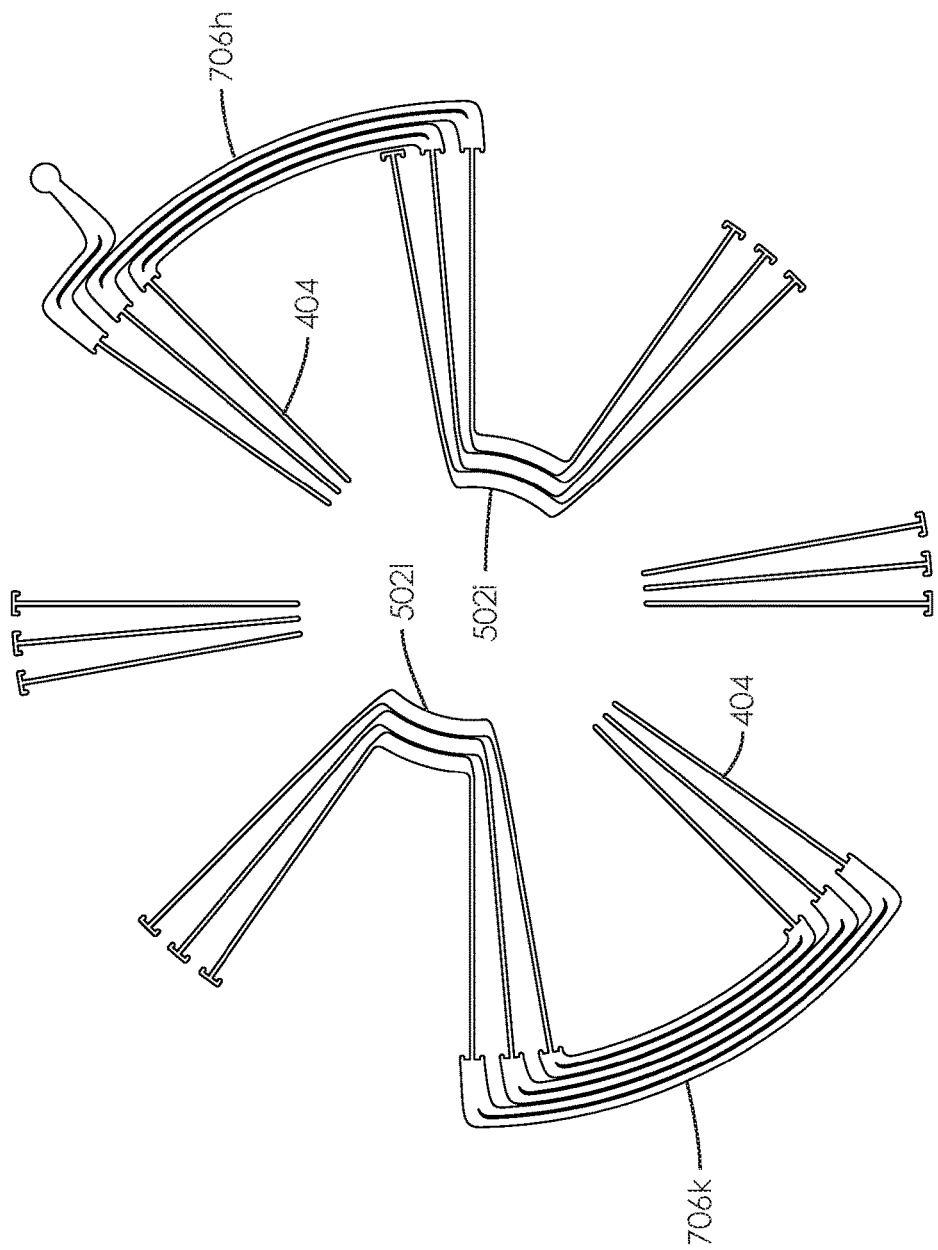
FIG. 15C shows the portions of the lower conductive layer shown in FIG. 15A that contribute to the windings for the first phase.

FIG. 15A shows an expanded (in the z-axis) perspective view of only the portions of the assembly shown in FIG. 14 that correspond to a first phase of the stator. As shown, the first phase may employ inner end turns 502b, 502e, 502i, 502l shown in FIGS. 5A and 5B, and outer end turns 706a, 706d, 706h, and 706k shown in FIGS. 7A and 7B. FIG. 15A thus illustrates how the windings for a single phase of a three phase stator can make their way through the assembly shown in FIG. 14. FIGS. 15B and 15C show, respectively, the portions of the upper and lower conductive layers shown in FIG. 15A that contribute to the windings for the first phase.

Figure 16A:
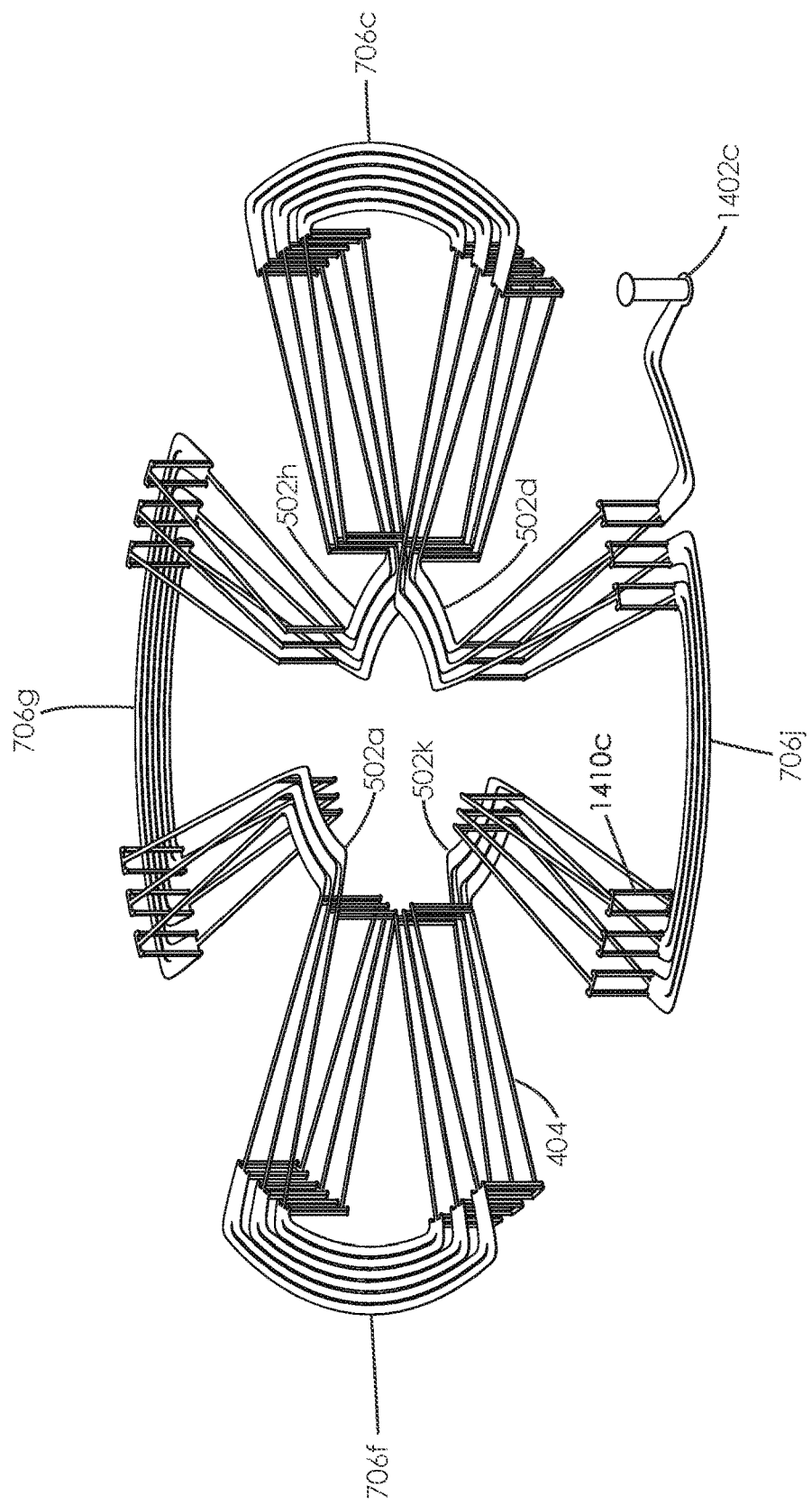
FIG. 16A illustrates how the windings for a second phase can make their way through the assembly shown in FIG. 14, with the portions of the assembly corresponding to the other two phases removed for illustration purposes.
Figure 16B:
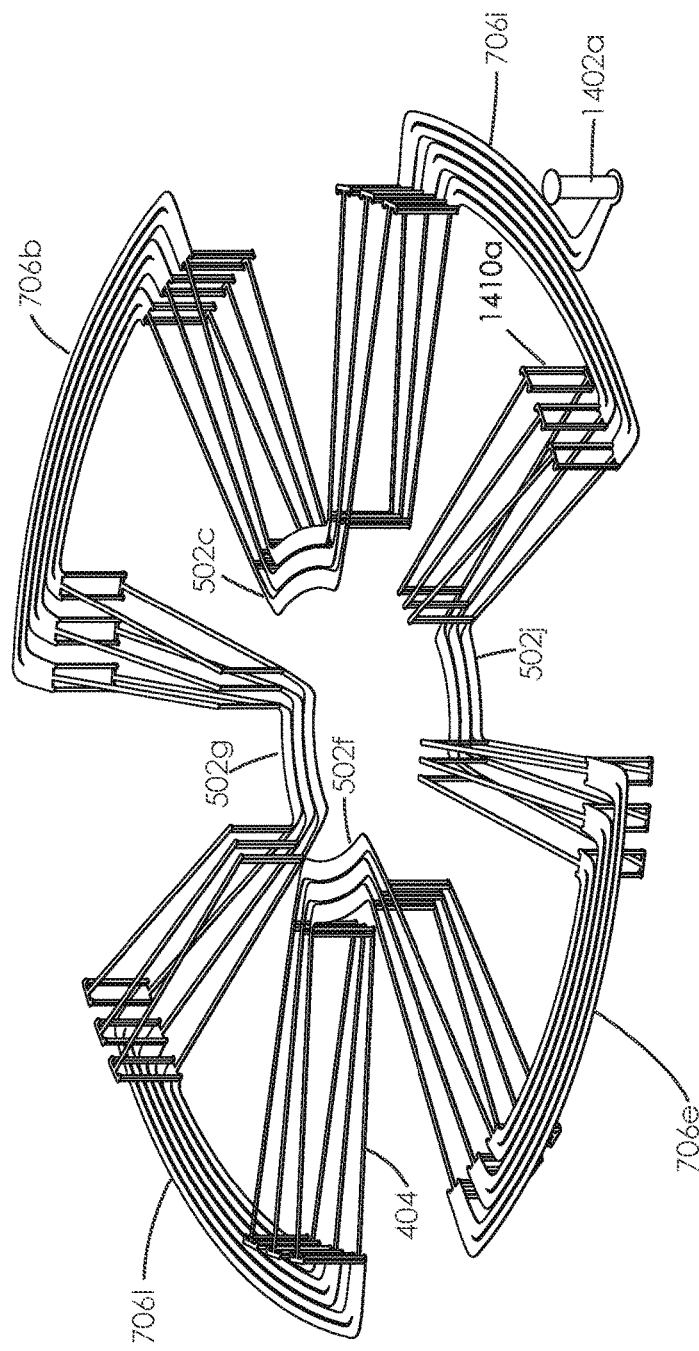
FIG. 16B illustrates how the windings for a third phase can make their way through the assembly shown in FIG. 14, with the portions of the assembly corresponding to the other two phases removed for illustration purposes.

Similar to FIG. 15A, FIGS. 16A and 16B illustrate how the windings of the two remaining phases can make their way through the assembly shown in FIG. 14, with the portions of the assembly corresponding to the other two phases removed for illustration purposes. As shown in FIG. 16A, a second phase may employ inner end turns 502a, 502d, 502h, 502k shown in FIGS. 5A and 5B, and outer end turns 706c, 706f, 706g, and 706j shown in FIGS. 7A and 7B. As shown in FIG. 16B, a third phase may employ inner end turns 502c, 502f, 502g, 502j shown in FIGS. 5A and 5B, and outer end turns 706b, 706e, 706i, and 706l shown in FIGS. 7A and 7B.

The two conductive layer implementation shown in FIGS. 14, 15A, 15B, 16A, and 16B represents the practical limit of reducing the number of layers required for a complete three-phase stator. It should be appreciated, however, that for such a configuration some mechanism will be needed to establish an electrical connection from a driving circuit (not shown) to a location inside of the serpentine winding for each phase. For example, with reference to FIG. 15A, an electrical connection will need to be made from such a driving circuit to the via 1410b (or another conductor), so as to allow the driving circuit to establish a complete circuit for the first phase. An electrical connection with the other end of the serpentine winding for the first phase can be established by way of through-via 1402b shown in FIG. 15A. Similarly, with reference to FIGS. 16A and 16B, electrical connections will need to be made from a driving circuit to the vias 1410c and 1410a (or other conductors), respectively, so as to allow the driving circuit to establish complete circuits for the second and the third phases. Electrical connections with the other ends of the serpentine windings for the second and third phases can be established by way of through-vias 1402c and 1402a shown in FIGS. 16A and 16B, respectively.

Such electrical connections may be established using any of several mechanisms, including through vias/solder pads/pressure contacts or pins to dedicated connection layers, connecting wires directly to the pads inside the outer end turns, or another similar technique. The maximum advantage of a two conductive layer approach like that illustrated in FIGS. 14, 15A, 15B, 15C, 16A, and 16B—assuming that no additional layer is needed to effect an electrical connection—is that the number of turns per layer can be increased by a factor of three over a configuration like that described in '625 patent, or by a factor of two over the configuration described above in connection with FIGS. 10A, 10B, 11A, 11B, 12A, 12B, 13A, and 13B. If additional layers are needed, for example, to construct a complete stator with neutral connection and terminals outside the outer end turn radius, this advantage decreases. Additionally, high density outer end turns may impact the ability to use of thermal features connected directly to the active region.

Although not shown in the drawings, it should also be appreciated that it is also possible to stack two or more assemblies similar to that shown in FIGS. 14, 15A, 15B, 15C, 16A, and 16B, and connect the windings of those assemblies together, either in parallel or in series. In some implementations, for example, the via 1410a shown in FIG. 15A could be connected to an "input" of serpentine winding of another, similar assembly having two conductive layers, e.g., using one of the connection techniques described in the preceding paragraph, thus establishing a series connection to additional turns for the first phase. In some embodiments, such a serpentine winding in the second assembly may traverse a similar, e.g., counter-clockwise, serpentine path as the first assembly but may instead wind "out" toward an outermost outer end turn 706. An additional electrical connection could likewise be established from that outermost end turn of the second assembly to an input of yet another serpentine winding on yet another assembly having just two conductive layers, and that additional serpentine winding could, for example, traverse a similar, e.g., counter-clockwise, serpentine path as the second assembly but may again wind "in," similar to the configuration of FIG. 15A. Such a technique of winding "in" and then winding "out" on respective, series-connected layers could be repeated any number of times to continue to increase the turn count of the respective phases. In some embodiments, two or more such respective assemblies may be laminated together to form a single planar composite structure (PCS).

FIGS. 17A and 17B illustrate an example of a process for forming a multi-layer PCS assembly/subassembly 1700. In the example shown, the PCS assembly/subassembly 1700 includes four conductive layers CL1, CL2, CL3, and CL4, and three non-conductive dielectric layers DL1, DL2, and DL3. It should be appreciated, however, that the technique described may additionally or alternatively be used to form PCS subassemblies and/or subassemblies with different numbers of layers.

In some embodiments, two or more dielectric layers DL1, DL2, DL3 may be interleaved with multiple conductive layers CL1, CL2, CL3, CL4 and laminated together. The patterns of conductive traces on each conductive layer CL1, CL2, CL3, CL4 may be arranged to form conductors for one or more circuit elements (e.g., portions of stator windings) and may be formed of an electrically conductive material, such as copper. Each conductive layer CL1, CL2, CL3, CL4 may be mechanically supported by at least one dielectric layer DL1, DL2, DL3. The dielectric layers may be formed of a non-conductive material, such as fiberglass. Each dielectric layer DL1, DL2, DL3 may thus electrically insulate a respective pair of the conductive layers CL1, CL2, CL3, CL4.

The conductor patterns of each conductive layer CL1, CL2, CL3, CL4 may be produced by various methods including, but not limited to, etching, stamping, spraying, cutting, or machining. In some implementations, for example, conductor patterns may be chemically etched into each side of a plurality of two-sided circuit boards, with each such circuit board including one sheet of fiberglass (e.g., dielectric layer DL1 or DL3 in FIG. 17A) sandwiched between two sheets of copper (e.g., CL1 and CL2 or CL3 and CL4 in FIG. 17A). Multiple two-sided circuit boards formed in this manner may then be stacked together, with a dielectric (e.g., fiberglass) sheet (e.g., dielectric layer DL2 in FIG. 17A) being sandwiched between each pair. The stacked two-sided circuit boards and fiberglass sheets may then be laminated together using heat and pressure to form a multiple board arrangement, like that shown in FIG. 17B. As noted, the resulting PCS may, for example, be used as a stator for an axial flux motor or generator.

In some embodiments, a PCS of the type described above may employ copper sheets that are thicker than the copper sheets used in most commonly produced circuit boards. In some implementations, for example, the copper sheets may have thicknesses ranging from 0.004 inches to 0.007 inches. Holes 1702 may be drilled in precise locations through one or more (or all) of the multiple circuit boards of a PCS 1700 and the inner walls of the holes may plated with a conductive material such as copper. The plated holes, also known as vias (e.g., blind or buried vias 310 shown in FIG. 3 or through-vias 1202a, 1202b, 120:2c, 1204a, 1204b, 1204c, 1206a, 1206b, and 1206c shown in in FIG. 12A) and, may act as interlayer conductors that electrically interconnect the conductive traces on different conductive layers of the PCS. It should be appreciated, however, that other types of interlayer conductors may additionally or alternatively be employed, including but not limited to, holes filled with conductive material, metal pins, crimp points, spot welds, or wire. The various conductors on the different layers of the PCS may be connected together in series and/or in parallel by such vias or other interlayer conductors.

As shown in FIG. 17B, the PCS 1700 may additionally include a center hole 1704 to accommodate a shaft of a rotor of an axial flux motor or generator, as described below.

The assemblies and/or subassemblies described herein can be employed in any known or future developed motor or generator, including the axial flux motors/generators described in the '625 patent, as well as the motors and generators described in U.S. Pat. No. 9,673,688, U.S. Pat. No. 9,673,684, and/or U.S. Pat. No. 9,800,109, the entire contents of all of which are incorporated by reference above.

Figure 18A:
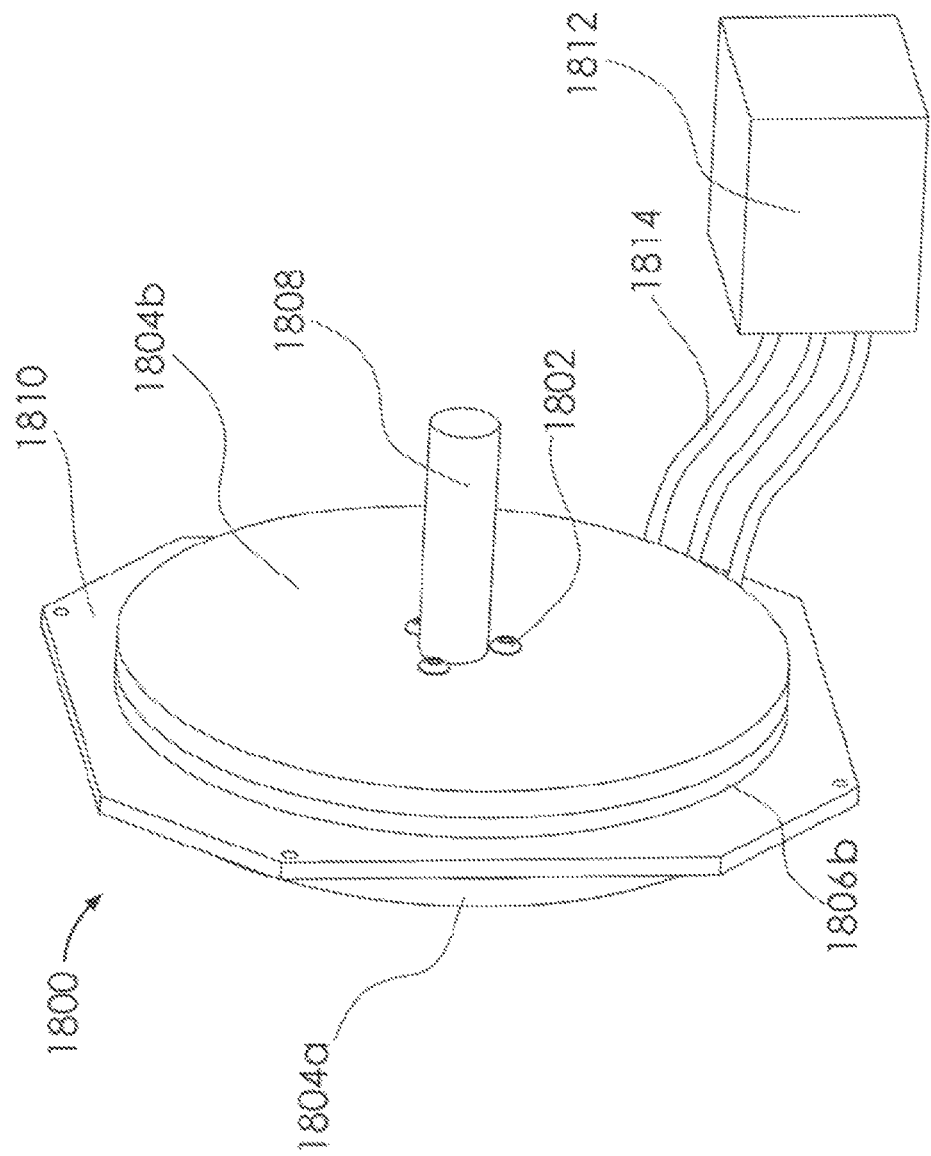
FIG. 18A illustrates a system in which a PCS like those described herein is employed as a stator in an axial flux motor or generator.
Figure 18B:
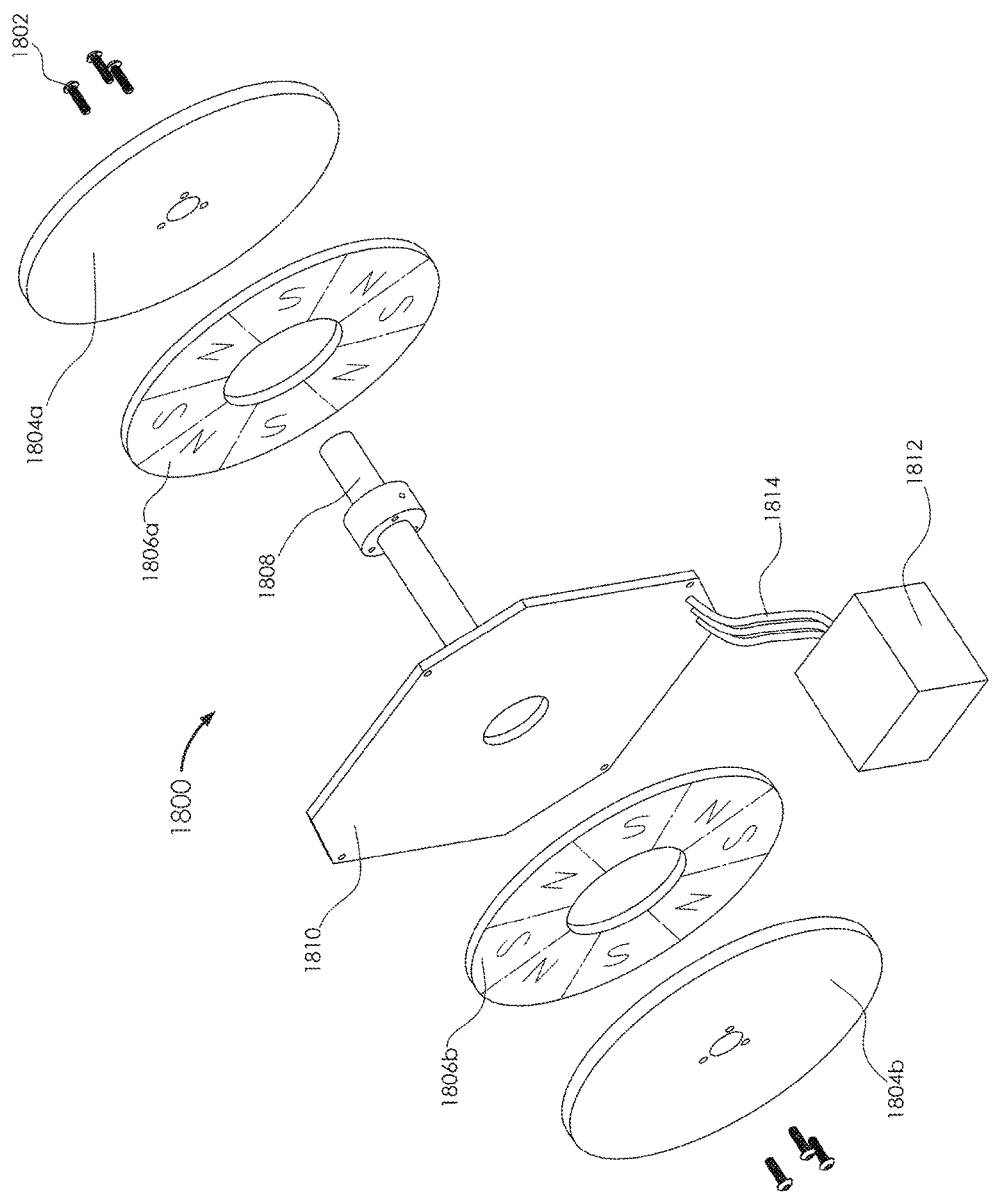
FIG. 18B illustrates an expanded view of the system shown in FIG. 18A.

FIG. 18A shows an example of a system 1800 employing a planar composite stator 1810 in an assembly with rotor components 1804a and 1804b, shaft 1808, screws 1802, wires 1814, and controller 1812. An expanded view showing these components and a means for their assembly is shown in FIG. 18B. The pattern of magnetic poles in the permanently magnetized portions 1806a, 1806b of the rotor assembly is also evident in the expanded view of FIG. 18B. FIG. 18A is an example of an embodiment where the electrical connections 1814 are taken at the outer radius of the PCS 1810, and the stator is mounted to a frame or case at the outer periphery. Another useful configuration, the "out-runner" configuration, involves mounting the stator at the inner radius, making electrical connections 1814 at the inner radius, and replacing the shaft 1808 with an annular ring separating the rotor halves. It is also possible to configure the system with just one magnet, either 1806a or 1806b, or to interpose multiple stators between successive magnet assemblies. Wires 1814 may also convey information about the position of the rotor based on the readings of Hall-effect or similar sensors mounted on the stator. Not shown, but similar in purpose, an encoder attached to the shaft 1808 may provide position information to the controller 1812.

The system 1800 in FIGS. 18A and 18B can function either as a motor, or a generator, depending on the operation of the controller 1812 and components connected to the shaft 1808. As a motor system, the controller 1812 operates switches so that the currents in the stator 1810 create a torque about the shaft, due to the magnetic flux in the gap originating from the magnets 1806a, 1806b connected to the shaft 1808. Depending on the design of the controller 1812, the magnetic flux in the gap and/or the position of the rotor may be measured or estimated to operate the switches to achieve torque output at the shaft 1808. As a generator system, a source of mechanical rotational power connected to the shaft 1808 creates voltage waveforms at the terminals 1812 of the stator. These voltages can either be directly applied to a load, or they can be rectified with a three-phase (or poly phase) rectifier within the controller 1812. The rectifier implementation 1812 can be "self-commutated" using diodes in generator mode, or can be constructed using the controlled switches of the motor controller, but operated such that the shaft torque opposes the torque provided by the mechanical source, and mechanical energy is converted to electrical energy. Thus, an identical configuration in FIG. 18A may function as both a generator and motor, depending on how the controller 1812 is operated. Additionally, the controller 1812 may include filter components that mitigate switching effects, reduce EMI/RFI from the wires 1814, reduce losses, and provide additional flexibility in the power supplied to or delivered from the controller.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A planar composite structure (PCS) for use in an axial flux motor or generator, comprising:
   a dielectric layer;
   a first conductive layer disposed on a first side of the dielectric layer, the first conductive layer comprising first conductive traces that include:
   first radial conductors, each of the first radial conductors extending radially at least between a first radial distance and a second radial distance that is greater than the first radial distance, and
   first conductive end turns, each of the first conductive end turns interconnecting a respective pair of the first radial conductors, the first conductive end turns including a first inner end turn and a second inner end turn, the first inner end turn electrically interconnecting portions of a first pair of the first radial conductors at the first radial distance, and the second inner end turn electrically interconnecting portions of a second pair of the first radial conductors at the first radial distance;
   wherein the first conductive traces form:
   a first portion of a first winding that, when energized, generates magnetic flux for a first phase of the motor or generator, the first portion of the first winding including the first inner end turn, and
   a first portion of a second winding that, when energized, generates magnetic flux for a second phase of the motor or generator, the first portion of the second winding including the second inner end turn;
   a second conductive layer located on a second side of the dielectric layer, the second conductive layer comprising second conductive traces that include second radial conductors, wherein each of the second radial conductors extends radially at least between the first radial distance and the second radial distance; and
   vias through the dielectric layer, each of the first radial conductors being electrically connected through at least one respective via to a corresponding one of the second radial conductors.

2. The PCS of claim 1, wherein:
   the first winding comprises a second portion electrically connected in series with the first portion of the first winding;
   the first conductive end turns further comprise a first outer end turn;
   the first outer end turn electrically interconnects a portion of one of the first pair of the first radial conductors at the second radial distance and a portion of another one of the first radial conductors at the second radial distance; and
   the second portion of the first winding comprises the first outer end turn.

3. The PCS of claim 2, wherein the first inner end turn and the first outer end turn are arranged so that the first and second portions of the first winding form a serpentine pattern.

4. The PCS of claim 3, wherein:
   second conductive traces form a third portion of the first winding, wherein the third portion of the first winding is connected in series with the second portion of the first winding.

5. The PCS of claim 4, wherein the second conductive traces further comprise:
   second conductive end turns, each of the second conductive end turns interconnecting a respective pair of the second radial conductors.

6. The PCS of claim 5, wherein:
   the second conductive end turns comprise a third inner end turn;
   the third inner end turn electrically interconnects portions of a first pair of the second radial conductors at the first radial distance; and the third portion of the first winding comprises the third inner end turn.

7. The PCS of claim 6, wherein:
the first winding comprises a fourth portion electrically connected in series with the third portion of the first winding;
the first conductive end turns further comprise a second outer end turn;
the second outer end turn electrically interconnects portions of a second pair of the second radial conductors at the second radial distance; and
the fourth portion of the first winding comprises the second outer end turn.

8. The PCS of claim 1, wherein:
the first winding comprises a first serpentine winding; and
the second winding comprises a second serpentine winding.

9. A planar composite structure (PCS) for use in an axial flux motor or generator, comprising:
a dielectric layer;
a first conductive layer located on a first side of the dielectric layer, the first conductive layer comprising first conductive traces that include:
first radial conductors, each of the first radial conductors extending radially at least between a first radial distance and a second radial distance that is greater than the first radial distance, and
first conductive end turns, each of the first conductive end turns interconnecting a respective pair of the first radial conductors;
a second conductive layer located on a second side of the dielectric layer, the second conductive layer comprising second conductive traces that include:
second radial conductors, wherein each of the second radial conductors extends radially at least between the first radial distance and the second radial distance, and
second conductive end turns, each of the second conductive end turns interconnecting a respective pair of the second radial conductors; and
vias through the dielectric layer, each of the first radial conductors being electrically connected through at least one respective via to a corresponding one of the second radial conductors; wherein:
the first conductive traces form a first portion of a winding that, when energized, generates magnetic flux for a first phase of the motor or generator,
the second conductive traces form a second portion of the winding,
the first portion of the winding is connected in series with the second portion of the winding, and
the first and second portions of the winding are configured and arranged such that a same amount of current flows through each of the first and second portions of the winding.

10. The PCS of claim 9, wherein:
the first conductive end turns comprise a first inner end turn;
the first inner end turn electrically interconnects portions of a first pair of the first radial conductors at the first radial distance;
the first portion of the winding comprises the first inner end turn;
the second conductive end turns comprise a second inner end turn;

the second inner end turn electrically interconnects portions of a first pair of the second radial conductors at the first radial distance; and
the second portion of the winding comprises the second inner end turn.

11. The PCS of claim 10, wherein:
the winding further comprises a third portion electrically connected in series between the first portion of the winding and the second portion of the winding;
the first conductive end turns further comprise a first outer end turn;
the first outer end turn electrically interconnects a portion of one of the first pair of the first radial conductors at the second radial distance and a portion of another one of the first radial conductors at the second radial distance; and
the third portion of the winding comprises the first outer end turn.

12. The PCS of claim 11, wherein the first inner end turn, the second inner end turn, and the first outer end turn are arranged so that the first, second, and third portions of the first winding form a serpentine pattern.

13. The PCS of claim 12, wherein:
the winding comprise a fourth portion electrically connected in series with the second portion of the winding;
the first conductive end turns further comprise a second outer end turn;
the second outer end turn electrically interconnects portions of a second pair of the second radial conductors at the second radial distance; and
the fourth portion of the winding comprises the second outer end turn.

14. A planar composite structure (PCS) for use in an axial flux motor or generator, comprising:
a first dielectric layer;
a first subassembly located on a first side of the first dielectric layer, the first subassembly including:
a second dielectric layer,
a first conductive layer located on a first side of the second dielectric layer, the first conductive layer comprising first conductive traces that form a first portion of a winding that, when energized, generates magnetic flux for a first phase of the motor or generator, wherein the first conductive traces include:
first radial conductors, each of the first radial conductors extending radially at least between a first radial distance and a second radial distance that is greater than the first radial distance, and
first conductive end turns, each of the first conductive end turns interconnecting a respective pair of the first radial conductors,
a second conductive layer located on a second side of the second dielectric layer, the second conductive layer comprising second conductive traces that include second radial conductors, each of the second radial conductors extending radially at least between the first radial distance and the second radial distance, and
first vias through the second dielectric layer, each of the first radial conductors being electrically connected through at least one respective first via to a corresponding one of the second radial conductors; and
a second subassembly located on a second side of the first dielectric layer, the second subassembly including:
a third dielectric layer, a third conductive layer located on a first side of the third dielectric layer, the third conductive layer comprising third conductive traces that form a second portion of the winding, wherein the third conductive traces include:
    third radial conductors, each of the third radial conductors extending radially at least between the first radial distance and the second radial distance, and
    second conductive end turns, each of the second conductive end turns interconnecting a respective pair of the third radial conductors, and
a fourth conductive layer located on a second side of the third dielectric layer, the fourth conductive layer comprising fourth conductive traces that include fourth radial conductors, each of the fourth radial conductors extending radially at least between the first radial distance and the second radial distance, and
second vias through the third dielectric layer, each of the third radial conductors being electrically connected through at least one respective second via to a corresponding one of the fourth radial conductors, wherein:
the first portion of the winding is connected in series with the second portion of the winding,
the first and second portions of the winding are configured and arranged such that a same amount of current flows through each of the first and second portions of the winding,
the first subassembly further includes a third portion of the winding, the third portion of the winding includes the first portion of the winding,
the third portion of the winding circumscribes a first region of the first subassembly at least once, the second subassembly further includes a fourth portion of the winding,
the fourth portion of the winding includes the second portion of the winding, and
the fourth portion of the winding circumscribes a second region of the second subassembly at least once.

15. A planar composite structure (PCS) for use in an axial flux motor or generator, comprising:
a first dielectric layer;
a first conductive layer on a first side of the first dielectric layer, the first conductive layer comprising first conductive traces, the first conductive traces including:
    first radial conductors that extend radially from a first radial distance to a second radial distance that is greater than the first radial distance, and
    first conductive end turns, each of the first conductive end turns interconnecting a respective pair of the first radial conductors;
a second conductive layer on a second side of the first dielectric layer, the second conductive layer comprising second conductive traces, the second conductive traces including:
    second radial conductors that extend radially from the first radial distance to the second radial distance, and
    second conductive end turns, each of the second conductive end turns interconnecting a respective pair of the second radial conductors;
first blind or buried vias through the first dielectric layer, each of the first radial conductors being electrically connected through at least one respective first via to a corresponding one of the second radial conductors;
a second dielectric layer;
a third conductive layer on a first side of the second dielectric layer, the third conductive layer comprising third conductive traces, the third conductive traces including:
    third radial conductors that extend radially from the first radial distance to the second radial distance, and
    third conductive end turns, each of the third conductive end turns interconnecting a respective pair of the third radial conductors;
a fourth conductive layer on a second side of the second dielectric layer, the fourth conductive layer comprising fourth conductive traces, the fourth conductive traces including:
    fourth radial conductors that extend radially from the first radial distance to the second radial distance, and
    fourth conductive end turns, each of the fourth conductive end turns interconnecting a respective pair of the fourth radial conductors;
second blind or buried vias through the second dielectric layer, each of the third radial conductors being electrically connected through at least one respective second via to a corresponding one of the fourth radial conductors; and
a third dielectric layer between the second conductive layer and the third conductive layer.

16. The PCS of claim 15, wherein:
the first radial conductors, the second radial conductors, the first conductive end turns, and the second conductive end turns establish electrical pathways for a first portion of a winding that, when energized, generates magnetic flux for a first phase of the motor or generator;
the third radial conductors, the fourth radial conductors, the third conductive end turns, and the fourth conductive end turns establish electrical pathways for a second portion of the winding; and
the first portion of the winding is connected in series with the second portion of the winding.

17. A planar composite structure (PCS) for use in axial flux motor or generator, comprising:
a first subassembly comprising first conductive layers that include first radial conductors that extend radially from a first radial distance to a second radial distance that is greater than the first radial distance, first end turn conductors, and second end turn conductors, wherein:
    the first end turn conductors interconnect a first group of the first radial conductors to form a first winding for a first phase of the axial flux motor or generator,
    the second end turn conductors interconnect a second group of the first radial conductors to form a second winding for a second phase of the axial flux motor or generator, and
    the first subassembly includes more second end turn conductors than first end turn conductors.

18. The PCS of claim 17, further comprising:
a second subassembly comprising second conductive layers, which are different than the first conductive layers, that include second radial conductors, third end turn conductors, and fourth end turn conductors, wherein:
    the third end turn conductors interconnect a first group of the second radial conductors to form a third winding for the first phase of the axial flux motor or generator,
    the fourth end turn conductors interconnect a second group of the second radial conductors to form a fourth winding for the second phase of the axial flux motor or generator, and the first subassembly includes more third end turn conductors than fourth end turn conductors.

19. The PCS of claim 18, wherein:
the third winding is connected in series with the first winding; and
the fourth winding is connected in series with the second winding.

20. The PCS of claim 18, wherein:
a number of the first end turn conductors plus a number of the third end turn conductors is equal to a number the second end turn conductors plus a number of the four end turn conductors.

21. The PCS of claim 17, wherein:
the first end turn conductors comprise first inner end turn conductors and first outer end turn conductors;
the second end turn conductors comprise second inner end turn conductors and second outer end turn conductors;
each of the first inner end turn conductors electrically interconnects portions of a respective pair of the first radial conductors at the first radial distance;
each of the first outer end turn conductors electrically interconnects portions of a respective pair of the first radial conductors at the second radial distance;
each of the second inner end turn conductors electrically interconnects portions of a respective pair of the first radial conductors at the first radial distance;
each of the second outer end turn conductors electrically interconnects portions of a respective pair of the first radial conductors at the second radial distance;
the first subassembly includes a same number of first inner end turn conductors as second inner end turn conductors; and
the first subassembly includes more second outer end turn conductors than first outer end turn conductors.

22. The PCS of claim 1, wherein:
the second conductive traces form a second portion of the first winding, wherein the second portion of the first winding is connected in series with the first portion of the first winding.

23. The PCS of claim 22, wherein the second conductive traces further comprise:
second conductive end turns, each of the second conductive end turns interconnecting a respective pair of the second radial conductors.

24. The PCS of claim 23, wherein:
the second conductive end turns comprise a third inner end turn;
the third inner end turn electrically interconnects portions of a first pair of the second radial conductors at the first radial distance; and
the second portion of the first winding comprises the third inner end turn.

25. The PCS of claim 24, wherein:
the first winding comprises a third portion electrically connected in series with the second portion of the first winding;
the first conductive end turns further comprise a first outer end turn;
the first outer end turn electrically interconnects portions of a second pair of the second radial conductors at the second radial distance; and
the third portion of the first winding comprises the first outer end turn.

26. The PCS of claim 1, wherein the first conductive traces are arranged so that the first portion of the first winding forms a serpentine pattern.

27. The PCS of claim 9, wherein the first conductive traces and the second conductive traces are arranged so that the first and second portions of the winding form a serpentine pattern.

28. The PCS of claim 1, wherein:
the first conductive end turns comprise a first outer end turn and a second outer end turn;
the first outer end turn electrically interconnects portions of a third pair of the first radial conductors at the second radial distance;
the second outer end turn electrically interconnects portions of a fourth pair of the first radial conductors at the second radial distance;
the first portion of the first winding comprises the first outer end turn; and
the first portion of the second winding comprises the second outer end turn.

29. The PCS of claim 6, wherein:
the first winding comprises a fourth portion electrically connected in series with the third portion of the first winding;
the second conductive end turns further comprise a second outer end turn;
the second outer end turn electrically interconnects a portion of one of the first pair of the second radial conductors at the second radial distance and a portion of another one of the second radial conductors at the second radial distance; and
the fourth portion of the first winding comprises the second outer end turn.

30. The PCS of claim 12, wherein:
the winding comprise a fourth portion electrically connected in series with the second portion of the winding;
the second conductive end turns further comprise a second outer end turn;
the second outer end turn electrically interconnects a portion of one of the first pair of the second radial conductors at the second radial distance and a portion of another one of the second radial conductors at the second radial distance; and
the fourth portion of the winding comprises the second outer end turn.

* * * * *